United States Patent [19]

Flagan et al.

[11] Patent Number: 4,642,227
[45] Date of Patent: Feb. 10, 1987

[54] REACTOR FOR PRODUCING LARGE PARTICLES OF MATERIALS FROM GASES

[75] Inventors: Richard C. Flagan, Pasadena, Calif.; Mohammed K. Alam, Athens, Ohio

[73] Assignee: California Institute of Technology, Pasadena, Calif.

[21] Appl. No.: 572,604

[22] Filed: Jan. 20, 1984

Related U.S. Application Data

[63] Continuation-in-part of Ser. No. 409,941, Aug. 20, 1982, abandoned.

[51] Int. Cl.$^4$ ............................................. C01B 33/02
[52] U.S. Cl. ................... 423/349; 423/350; 422/150; 422/158; 427/86; 118/716
[58] Field of Search ................................. 423/348–350, 423/DIG. 16; 422/150, 158; 427/86; 118/716

[56] References Cited

U.S. PATENT DOCUMENTS

| | | | |
|---|---|---|---|
| 3,371,997 | 3/1968 | Jordan et al. | 423/450 |
| 4,013,420 | 3/1977 | Cheng | 422/156 |
| 4,084,024 | 4/1978 | Schumacher | 423/350 |
| 4,154,870 | 5/1979 | Wakefield | 423/350 X |
| 4,241,022 | 12/1980 | Kraus et al. | 422/156 |
| 4,292,344 | 7/1981 | McHale | 423/349 X |
| 4,314,525 | 2/1982 | Hsu et al. | 423/349 X |
| 4,327,069 | 4/1982 | Cheng | 423/450 |

OTHER PUBLICATIONS

"Silane Pyrolysis in a Free-Space Reactor," by James R. Lay & Sridhar K. Iya, Proc. of the 15th IEEE Photovoltaic Specialists Conference, Jun. 1981, pp. 565-568.
"The Effect of a Growing Aerosol on the Rate of Homogeneous Nucleation of a Vapor," by Andrew J. Pesthy, Richard C. Flagan & John H. Seinfeld, Journal of Colloid and Interface Science, vol. 82, No. 2, Aug. 1981, pp. 465-479.
"On the Modeling of Silane Pyrolysis in a Continuous Flow Reactor" by Ananda K. Praturi, Ravi Jain & George C. Hsu, Low-Cost Solar Array Project, DO-E/JPL-1012-21.
"Capacitively-Heated Fluidized Bed, Preferential Heating of Seed Particles Aids Silicon Production" by E. J. McHale, NASA Tech Briefs, Spring 1981.
"The Behavior of Constant Rate Aerosol Reactors" by S. K. Friedlander Aerosol Science and Technology (1980) pp. 3-13.
"Aggregation and Growth of Submicron Oxide Particles in Flames" by Gail D. Ulrich and John W. Riehl, Journal of Colloid and Interface Science, vol. 87, No. 1, May 1982, pp. 257-265.

Primary Examiner—William R. Dixon, Jr.
Assistant Examiner—Steven Capella
Attorney, Agent, or Firm—Freilich, Hornbaker, Rosen & Fernandez

[57] ABSTRACT

A method and apparatus is disclosed for producing large particles of material from gas, or gases, containing the material (e.g., silicon from silane) in a free-space reactor comprised of a tube (20) and controlled furnace (25). A hot gas is introduced in the center of the reactant gas through a nozzle (23) to heat a quantity of the reactant gas, or gases, to produce a controlled concentration of seed particles (24) which are entrained in the flow of reactant gas, or gases. The temperature profile (FIG. 4) of the furnace is controlled for such a slow, controlled rate of reaction that virtually all of the material released condenses on seed particles and new particles are not nucleated in the furnace. A separate reactor comprised of a tube (33) and furnace (30) may be used to form a seed aerosol which, after passing through a cooling section (34) is introduced in the main reactor tube (34) which includes a mixer (36) to mix the seed aerosol in a controlled concentration with the reactant gas or gases.

13 Claims, 22 Drawing Figures

```
SOURCE
OF GAS, OR     ──13
GASES
```

GAS, OR GASES

```
REACTOR FOR        ──10
SEED AEROSOL        11
PRODUCTION
```

SEED AEROSOL

FIG. 1

```
SLOW, CONTROLLED
RATE REACTOR       ──12
FOR LARGE
PARTICLE GROWTH
```

LARGE PARTICLES

```
CONTINUOUS
CRYSTAL OR WEB
GROWTH FROM        ──14
MELT OF
PARTICLES
```

REACTOR FOR PRODUCING LARGE PARTICLES OF MATERIALS FROM GASES

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

This application is a continuation-in-part of application Ser. No. 06/409,941, filed Aug. 20, 1982, now abandoned.

BACKGROUND OF THE INVENTION

This invention relates to a method and apparatus for producing large particles of material, and more particularly to a free space reactor for producing large particles greater than a few microns in diameter (preferably in the range of 10 to 100 microns) from a gas or gases.

There is a growing need for producing high-purity material inexpensively, such as silicon widely used for semiconductor devices, integrated circuits and solar cells. There are known techniques available for producing high-purity gases as intermediates from low grade material. These gases may then be used to produce high-purity material. However, known techniques for producing materials from gas, such as the Siemens process, are expensive batch processes. What is required is an inexpensive continuous process for producing material from gas, or gases.

A good example of the problem to be solved by the present invention is producing high-purity silicon from high-purity silane obtained as an intermediate from metallurgical grade silicon. At present most of the high grade purity silicon is produced by epitaxial reactors in the form of films, or in a bell jar or tubular reactors in bulk form. These are batch operation reactors with high energy and labor consumption. Consequently, the cost of production is high. What is required is a continuous, low-cost process.

Previous attempts by others to solve the problem have utilized a continuous flow reactor in which silicon aerosol is obtained from silane by thermal decomposition:

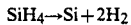

$$SiH_4 \rightarrow Si + 2H_2 \qquad (1)$$

as described by James R. Lay and Sridhar K. Iya, "Silane Pyrolysis in a Free-Space Reactor," Proc. 15th IEEE Photovoltaic Specialists Conference, pp 565–68 (June 1981). Because silane introduced through a port at the top of the reactor is immediately subjected to high temperature (1105°–1285° K.) within the reactor, homogeneous reaction occurs almost instantaneously as the silane enters the reactor. The silicon produced by the reaction nucleates and forms very fine silicon particles. These fine particles grow to a maximum size less than 1 micrometer by condensation of silicon and coagulation of the fine particles thus produced. The particles are continually filtered out at the bottom of the reactor as a powder.

Since silane can be fed to the reactor continuously, it would be possible to produce such high-purity silicon powder on a continuous basis. However, the powder is so fine, like lamp black, that subsequent processing is difficult. One method to obtain larger particles by coagulation and agglomeration is described by S. K. Friedlander in a paper titled "The Behavior of Constant Rate Aerosol Reactors," Aerosol Science and Technology 1:3–13 (1982). Friedlander describes a constant rate tubular flow aerosol reactor in which the reactant concentrations and reactor temperature remain approximately constant, and the rate of formation of aerosol material is also approximately constant. Such a reactor is suggested by Friedlander for application as a catalytic flow reactor since fresh surface area for catalytic reactions can be continually produced. The technique is to produce a large number of very small particles by homogenous nucleation of the products of gas phase reactions. The rate of chemical reaction which produces aerosol material is then controlled such that that fresh surface area is continually created by nucleation of new particles or growth of the existing particles. Nucleation continues as long as the stable clusters (small particles) are not present in sufficient concentration to scavenge the monomer molecules or smaller clusters. Once this critical point is passed, particles grow by vapor deposition, coagulation and agglomeration.

This technique of Friedlander is highly desirable if one's objective is the production of a high surface area to be used to promote catalytic chemical reactions. It is, however, not well suited to the production of bulk material because the number of small particles formed by nucleation in such a reactor is very large and coagulation is much too slow to achieve adequate growth of the particles thus produced within residence times practical for gas flow reactors. In contrast to the approach of Friedlander, the present invention limits the number of particles produced by nucleation in the reactor by allowing only a small amount of the reactant gas or gases entering the reactor to react sufficiently rapidly to form new particles by nucleation, then mixes those few seed particles with the primary reactant flow, and carries the primary reaction out at a slow rate to prevent any further nucleation. By this means, the present invention can quickly grow particles in excess of 10 microns in size without relying on the slow process of coagulation and agglomeration as primary growth mechanisms.

Another approach to the problem of producing silicon particles from pyrolytic reaction of silane involves the use of a "fluidized bed" in which a stream of silane and hydrogen flows through a bed of silicon particles. The flow of these gases suspend and agitate the particles to form a fluid-like bed, hence the term "fluidized bed." Silicon seed particles fed into a chamber near the top settle into the fluidized bed where they are heated to about 1075' K. Silane flowing up through the bed decomposes by pyrolytic reaction and deposits monomer molecules on the existing particles to make some particles grow larger. The larger particles thus grown precipitate out through the bottom of the bed, or are extracted from the bed. Some of the silane decomposes homogeneously leading to the formation of fine silicon powder. Larger particles filter out some of the smaller particles. This fluidized-bed approach produces larger particles than the free-space reactor described by Lay and Iya (supra), but it too may produce a fine powder of silicon that is too difficult to handle for subsequent processing.

OBJECT AND SUMMARY OF THE INVENTION

An object of this invention is to provide a method and apparatus for producing submicron seed particles of material from a gas, or gases, and depositing vapor material on the seed particles thus produced to grow large particles greater than a few microns in diameter.

Silane is used hereinafter as an example for producing silicon particles, but it will become apparent that halosilanes, such as dichlorosilane, may be used instead, and may involve the use of other reactants. Still other gases may be used in accordance with this invention for producing particles of other material, either single element or compound, such as GeSiN, SiC, or GaAs, and others. Consequently, although production of large silicon particles from silane in a free-flow reactor is an important part of the invention, it should be understood that the invention is not so restricted. Nor is the invention restricted to pyrolytic reaction of the gas, or gases, since the rate of chemical reactions between two or more gases can also be controlled, such as by control of one or more parameters known to affect the rate of reaction in a given system, such as the pressure, temperature, rate of mixing and proportions of the reactant gases.

Briefly, in its broadest aspects, the invention is comprised of the controlled rate of reaction of a gas, or gases, in a free-flow reactor containing constituents of the material from which large particles are to be grown on a predetermined concentration (or limited number) of seed particles. Referring to silicon particles as the example, a gas, or gases, containing silicon (e.g., SiH$_4$) is introduced into the free-space reactor, and seed particles of silicon, which may be produced preliminarily by reaction of a small amount of the gas or gases, are mixed with the main flow of gas, or gases, in a concentration (number of particles per unit volume of gas) which is sufficient to prevent nucleation of new particles thereby to allow the seed particles to grow from the amount of reactant available in the gas. As the gas, or gases, flow in the reactor, they are subjected to a reaction so controlled as to minimize the formation of new particles by homogeneous nucleation while depositing additional silicon on the seed particles.

In one embodiment, a hot nonreacting gas (e.g., Ar, N$_2$, or H$_2$), is introduced into the reactor at the center of the flow of the reactant gas, or gases. Heat thus introduced produces sufficient reaction of the gas, or gases, for submicron seed particles to be formed by homogeneous nucleation. The remaining reactant gas, or gases, carry the seed particles through a temperature controlled furnace surrounding the reactor where reaction of the gas, or gases, is allowed to take place at a slow, controlled rate. The ensuing decomposition of gas produces free aerosol material at such a slow rate that virtually all of it condenses on the seed particles to produce larger particles. In that manner, the growth of particles is promoted without nucleating significant numbers of new submicron particles which might not have an opportunity to grow to large size (about 10 to 100 microns).

In another embodiment, the seed particles are formed by flowing the gas, or gases, through a preliminary temperature controlled furnace which decomposes enough gas to produce submicron seed particles. The function of the hot gas used in the first embodiment, which is to heat a small amount of the reactant gas to a temperature sufficiently high for decomposition of part of the gas, is thus replaced by a preliminary furnace. Since this preliminary furnace may cause very nearly all of the reactant gas passing through it to decompose, and thus be used to form seed particles, additional reactant gas is introduced downstream from the preliminary furnace. Mixing in the reactor assures uniform dispersion of seed particles in the reactant gas stream which then passes through a main furnace.

The seed particles of submicron size thus produced through homogeneous nucleation of aerosol material in either embodiment is grown to larger sizes by homogeneous or heterogeneous reaction of additional reactant gas, or gases, at a rate so controlled as to prevent formation of significant numbers of new submicron particles while aerosol material produced in the reactor is deposited on seed particles. Due to their larger size, the particles thus grown have enough mass to allow them to be collected by gravity or inertial force for immediate further processing (or for later processing).

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1 illustrates in a general block diagram a continuous process for industrial application such as growing large crystals in either bulk or sheet form pulled from a melt fed with particulate material by a free-space reactor which, in accordance with the invention, first produces seed particles from a continuous flow of gas, or gases, and then grows larger particles from the flow of the same gas, or gases.

FIG. 7 is a graph of predicted temperature profile (dashed line) and reaction kinetics (solid line) as a function of time in the reactor. The ordinate for the kinetics is on the right. The dashed-dot line is what the temperature profile for an optimized system might look like.

DESCRIPTION OF PREFERRED EMBODIMENTS

Figure 2:
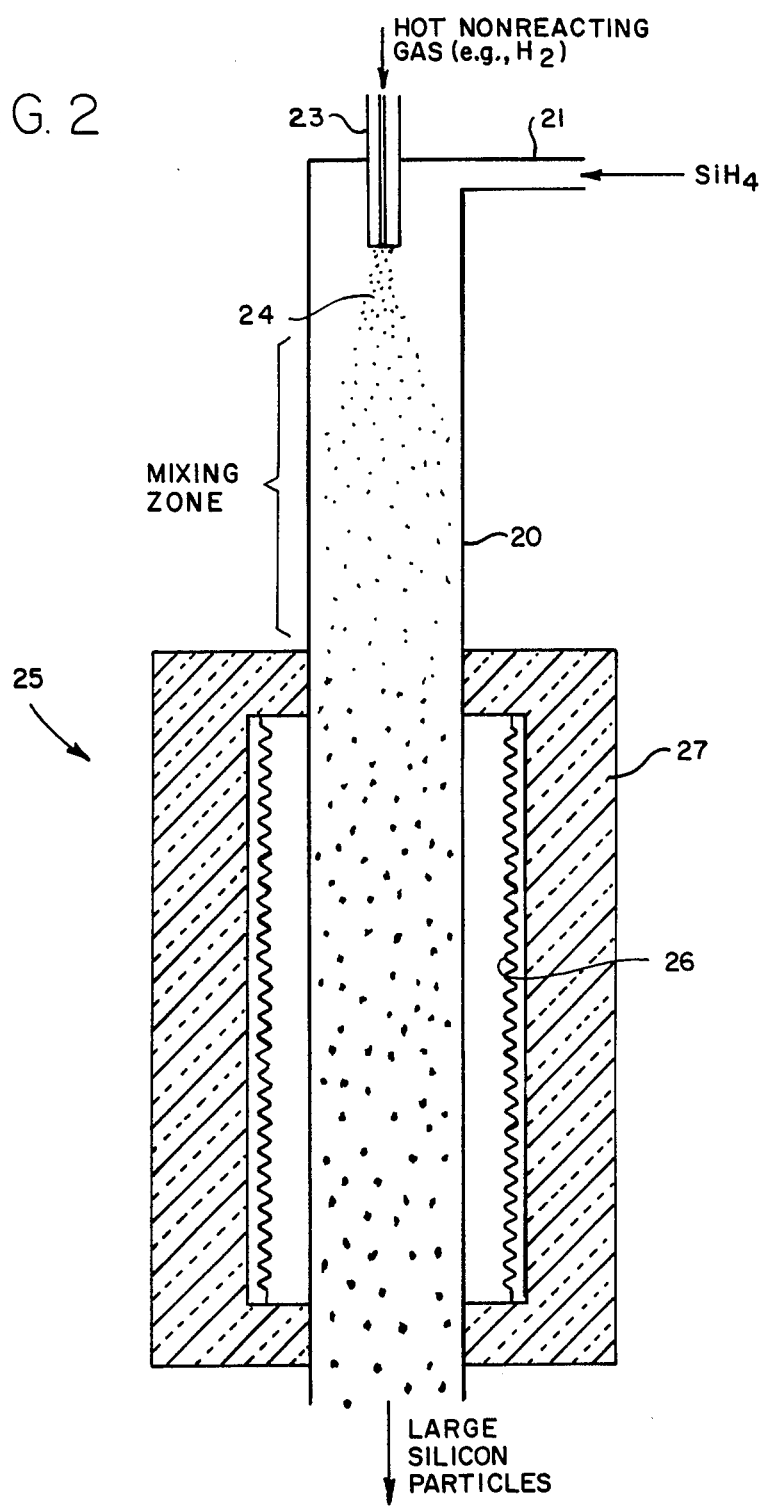
FIG. 2 illustrates a first embodiment of a free-space reactor for the present invention.

Referring to FIG. 1, a general flow chart is illustrated for producing high-purity particles larger than 3 to 4 microns, and preferably in the range of 10 to 100 microns, using a free-space reactor 10. The reactor has a first section 11 for producing an aerosol of submicron seed particles from homogeneous reaction of gas phase reactants, and a second section 12 for growing the seed particles to larger size (about 10 to 100 microns).

The seed particles are grown to a larger size in one or more sections of a controlled rate reactor 12 by homogeneous or heterogeneous reaction of additional gas at a slow controlled rate in order to prevent formation of additional new particles from the products of reactions while the particles are being grown large enough to be collected by gravity or inertial forces for immediate use in a subsequent process, or for storage and later use.

The complete exemplary process includes a source 13 of a continuous flow of gas phase reactants at a rate sufficient to support continuous operation of the free-space reactor 10. The reactor, in turn, may be of sufficient capacity to supply a process 14 such as continuous growth of a large crystal or web from a melt, or growth of a large crystal by deposition and recrystallization, although in practice the large particles grown may be collected and stored for use at a later time.

For the purpose of describing the free-space reactor in detail, it will be assumed that material that is to be produced in particle form is silicon from silane, or other silicon containing gases, by reaction of the gas in the first section 11 to produce seed particles through homogeneous nucleation, and reaction of additional gas in the second section 12 to grow larger particles from the seed particles. To make this possible, a reactor tube is employed for both sections, as will now be described for two specific embodiments with reference to FIGS. 2 and 3.

Referring now to FIG. 2, a quartz reactor tube 20 is fitted with tubing 21 through which a reactant gas ($SiH_4$) is introduced under sufficient pressure to maintain a steady flow. The flow may be downward, as illustrated, to take advantage of the natural tendency of grown particles to fall through the tube 20 under the force of gravity, but the reactor could be inverted to take advantage of the natural tendency of the heated gases to rise through the tube. In either case, the particles are carried by the flow of carrier gas out of the tube 20 where they may be collected by inertial or gravitational forces, or by filtration or other means. The carrier gas itself is vented, such as through side ports near the exit end of the reactor tube, into an exhaust manifold from which the carrier gas may be recirculated into the reactor.

As will be explained more fully below, the gas introduced into the reactant tube 20 is silane and, possibly, a carrier gas (e.g., $H_2$). In this first embodiment, heat required for a small amount of pyrolytic reaction is introduced in the flow of silane by heating a gas (e.g., $H_2$) to about 1175° K. and introducing the heated gas through a nozzle 23 in the center of the silane flow within the reactor tube 20, although other means may be used to heat a small volume of reactant gas, e.g., focused light from a laser or other source at a wavelength absorbed by one or more of the reactant gases. The silane near the nozzle 23 is thus heated to sufficiently high temperature to produce pyrolytic reaction of a small percentage of the silane and cause nucleation of free silicon to take place. This nucleation produces seed particles 24 of submicron size (10 Å to 1.0 micron). The number concentration of seed particles is controlled by means of the amount of heat added, temperature, and time available for coagulation of the seed particle, such that the amount of reactant remaining in the gas is sufficient to grow the particles to the desired size.

The seed particles are entrained in the mixture of silane and hydrogen, which then flows through a mixing zone in the reactor tube 20 and then through a heating zone, which may be a furnace 25 comprised of separate heating coils 26 disposed along a length of the tube 20 within an insulating jacket 27. The temperature of the furnace 25 is so controlled by separately regulating current through the heating coils as to raise the temperature of the mixture steadily from about 575° C. at one end to about 1000° C. at the other end, or with some other temperature profile designed for a slow, controlled rate of reaction, as will be explained more fully hereinafter with reference to FIG. 4.

This controlled heating of the gas as it flows through the furnace 25 produces homogeneous reaction of additional silane at the desired slow, controlled rate in order to prevent formation of additional new particles from the additional silicon thus released. In that manner, virtually all of the additional silicon aerosol material is allowed to deposit on the seed particles to grow larger particles, although heterogeneous reaction may also contribute to particle growth. The few new particles that may be nucleated will usually agglomerate with larger particles. Particles may be grown by this method in one or more stages of controlled reaction rate to large sizes (10 to 100 microns), large enough to allow collection under gravitational or inertial force for use in a melt for growing large silicon crystals in a continuous process or, if desired, in a container for subsequent use.

Under this controlled reaction rate, each seed particle in space will scavenge silicon vapor material at a rate sufficient to prevent nucleation of new submicron particles. This is important to this invention in order for all of the material released by the reaction to be used in growing larger particles. Briefly, radial distribution of partial pressure develops in time about the growing particle. As material is condensed on growing particles, the latent heat of condensation at the particle surface produces a nonuniform temperature profile about the growing particle. The scavenging of vapor molecules in the immediate vicinity of the growing particle and the nonuniform temperature profile about the growing particle prevent nucleation of new particles within the sphere of influence of the growing particle. The seed particles entrained in the reactant gas, or gases, are thus allowed to grow at the rate aerosol material is released by the controlled rate of reaction. Consequently, there is at all times insufficient free aerosol material for significant homogeneous nucleation of new submicron particles. There is therefore reasonable assurance that all particles will be grown to a larger size. As noted above, any submicron particles that may emerge in the stream will likely agglomerate with large particles.

For a more complete understanding of how growing particles alter the vapor concentration, gas temperature, and nucleation rate near the particle, see "The Effect of Growing Aerosol on the Rate of Homogeneous Nucleation of a Vapor" by Andres J. Pesthy, Richard C. Flagan and John H. Seinfeld, published by Academic Press, Inc. in the Journal of Colloid and Interface Science, Vol. 82, No. 2, pp 465-79 (1981).

Figure 3:
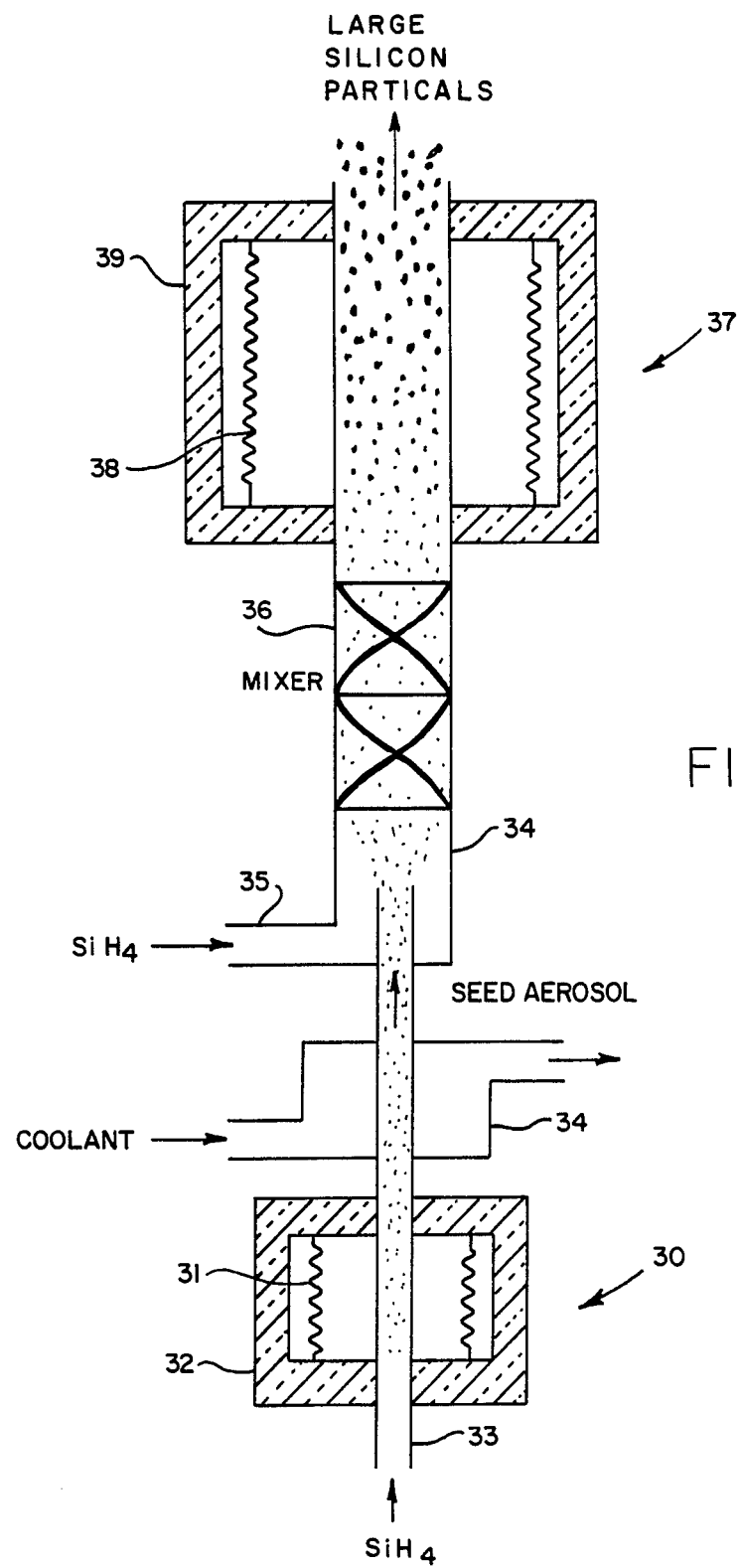
FIG. 3 illustrates a second embodiment of a free-space reactor for the present invention.

FIG. 3 illustrates a second embodiment of the invention in which the seed particles are produced by pyrolytic reaction in a first furnace 30 having heating coils 31 in an insulating jacket 32. At the bottom of a reactor tube 33, a small amount of silane is introduced. As this gas passes through this first (preliminary) furnace 30 (at a temperature greater than about 1000° C.), silicon seed particles are produced by nucleation of the products of homogeneous reaction. The mixture then passes through a cooling section 34 to stop any further reaction, and above the cooling section silane (SiH$_4$) is fed into a larger reactor tube 33' through a tube 35. The number concentration of seed particles may be controlled within the first reaction zone by control of the rate of reaction or by means of the relative flows through the first and second reaction zones.

A mixer 36 in the reactor tube 33' assures that the seed aerosol is thoroughly mixed with pure silane to send a homogeneous mixture of silane and seed particles through a second (main) furnace 37 comprised of heating coils 38 and insulating jacket 39. The products of the pyrolysis reaction condense on the seed particle as they pass through the main furnace 37. In that manner, the preliminary furnace 30 heats a small quantity of silane to produce seed particles through homogeneous nucleation. A large quantity of silane added to the stream containing these seed particles is then heated in the main furnace to produce homogeneous reaction at a slow, controlled rate to grow large particles from the seed particles. As in the first embodiment, this controlled rate prevents homogeneous nucleation of additional particles so that all of the silicon will deposit on growing particles by condensation or by heterogeneous reaction.

The free-space reactor of FIG. 3 is shown with the flow of seed particles entrained in the reactant gas, or gases, upward through the main furnace to take advantage of the tendency of the hot reactant gas, or gases, to flow upward. At the exit of the reactor tube 33', a cyclone separator, or similar structure, may be employed to separate the particles from the effluent gases which are diverted into an exhaust manifold and from there recirculated through the system, or otherwise used to recover the thermal energy and chemicals in the effluent gases.

From the foregoing, it should now be evident that the key to the success of this method of growing large particles in a free-space reactor by homogeneous or heterogeneous reaction of additional gas is to control the number concentration of seed particles such that the amount of reactant in the gas is sufficient to grow them to a predetermined size and further to control the rate of reaction in order to prevent formation of additional new submicron particles by homogeneous nucleation of free silicon while large particles are being grown. In the exemplary embodiments, this reaction control is effected by a furnace in which the temperature of the reactant gas, or gases, is controlled. While various factors must be taken into consideration in determining how much energy is required by the furnace, such as the diameter of the reactor tube, it is sufficient to understand that the rate of reaction of the gas, or gases, containing material to be released is so controlled as to cause virtually all of the aerosol material released to deposit on seed particles and leave no significant excess of material for nucleation of new seed particles.

The controlled rate of reaction in the main furnace is achieved by control over the temperature of the reactant gas from about 575° C. at the entrance to the furnace to about 1000° C. at the exit. One example of such control is illustrated by the solid line graph in FIG. 4 of reactant temperature over the distance along the main furnace. A temperature of about 575° C. is held over most of the distance in the furnace (the primary reaction zone) to allow pyrolytic decomposition of the gas at a rate just below the rate that would be required for homogeneous nucleation of particles. Nearly all of the gas will be decomposed by the time it reaches the end of the furnace. To assure complete decomposition, the temperature may be raised to about 1000° K. in the remaining (burnout) zone of the furnace. Since there is very little gas left to decompose in this burnout zone, the higher rate of reaction will not produce sufficient free silicon molecules to sustain homogeneous nucleation. Also within this high temperature burnout zone, the trace hydrogen content of the silicon particles may be reduced.

Figure 4:
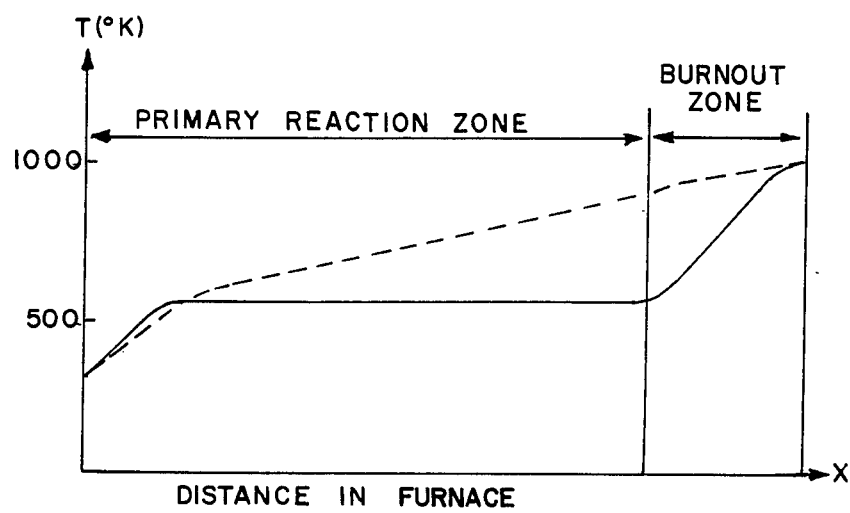
FIG. 4 illustrates exemplary profiles of controlled temperature along the length of a reactor for growing larger particles from seed particles by homogeneous or heterogeneous reaction of additional gas at a slow, controlled rate in order to prevent formation of additional new particles by homogeneous nucleation while the particles are grown large enough to collect or deposit by gravity or inertial force.

Another control scheme is illustrated by a dotted line graph in FIG. 4. Again the temperature of the reactant gas at the entrance to the furnace is at about 575° K., but now the temperature is gradually increased over the entire length of the furnace in such a manner that the homogeneous silane pyrolysis rate is continually increased to take advantage of the growing particles increasing ability to inhibit nucleation.

For the reader to better understand how the control is designed for a particular system, an experimental system will now be described for a free-flow silane reactor in which the number concentration of seed particles and the rate of reaction are predetermined and controlled. Where the system was not optimized, it will be shown how the system may be readily optimized by design of the temperature profile of the reactor (temperature along the length of the free-flow reactor.

It should first be understood from the foregoing that growth of particles by vapor deposition is achieved in preference to the formation of new particles by homogeneous nucleation. This preference of particle growth is achieved by limiting the rate of the gas phase reactions to the point that growing seed particles already present can scavenge considerable reaction products at a rate sufficient to keep the vapor pressure low enough to prevent significant additional particle formation.

The prior art, free-flow reactors were operated at sufficiently high temperatures to ensure complete pyrolysis of the silane feed gas within a limited residence time (about 5 seconds). The high rate of generation of condensible products of reaction resulted in a high nucleation rate and the formation of a large number of very small particles. Even after condensation of the remaining vapor on these nuclei, these particles remained submicron in size. Much work on the free-space reactor has been devoted to increasing the size of the silicon particles. These previous efforts to increase particle size have focused on particle growth by coagulation.

The calculated evolution of particle size distribution in normal operation of a continuous flow pyrolyzer operated in accordance with that prior art shows the mean diameter of the product at the end of about 4 seconds residence time to be about 0.2 micron. It is thus apparent that particle growth by coagulation is too slow to obtain particles greater than the submicron range. Theoretical predictions of the sort described by Friedlander confirm this observation. See R. C. Flagan, and M. K. Alam, "Factors Governing Particle Size in the Free Space Reactor," Proc. of the Flat-Plate Solar Array Workshop on the Science of Silicon Material, The Pointe, Phoenix, Ariz., Aug. 23-25, 1982. DOE/JPL Report Number DOE/JPL-1012-81.

Therefore, particle growth must be achieved by vapor deposition (and some reaction) on the particles. However, if the large number concentrations produced in the initial burst of nucleation is unlimited, as in the prior art, growth significantly beyond the submicron range is not practical. Large particles (10 microns or more) can be grown by vapor deposition only if the number concentration is reduced by several orders of magnitude and maintained at a low level throughout the free-flow reactor. This requires that a controlled number concentration of seed particles be introduced and additional nucleation be prevented in the reactor.

From the theory developed hereinafter, the method employed to prevent nucleation is to keep the total clearance volume fraction, $\Omega$, greater than unity. In general, this condition can be met by doing any of the following:

(1) Maintain number concentration of seed particles at a sufficiently high level, or
(2) Keep the concentration of condensible products of reaction low.

However, for the invention, the object is to decrease the number concentration of the seed particles as much as possible in order to maximize particle size, and vapor pressure is kept low by limiting the rate of silane decomposition. Thus, the technique for producing large particles in the silicon free-space reactor is to start with a small number of seed particles and to control the temperature of the reaction at a lower level than the prior art thereby limiting the rate of silane decomposition and allowing the seed particles to grow.

An understanding of the kinetics of silane decomposition is important for control of the system. Although not yet fully understood, Purnell and Walsh, Proc. Royal Soc., Vol. 293, 543–561 (1966), made a pioneering study in which pyrolysis of silane was carried out at 650° K. to 700° K. in a static system. The products were seen to be hydrogen, disilane ($Si_2H_6$) and a solid product with the composition $(SiH_x)_n$. The hydrogen to silicon ratio x had the value 2 when the solid product was first formed, but decreased with reaction time, and ultimately pure silicon is obtained.

A detailed analysis by Purnell and Walsh of the initial part of the reaction, during which 0 to 3 percent decomposition occurs, suggested a unimolecular decomposition with a temperature and pressure dependent rate constant. Two mechanisms were postulated. On the basis of thermodynamic considerations, Purnell and Walsh favored the following mechanism:

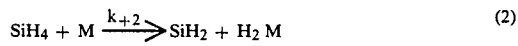

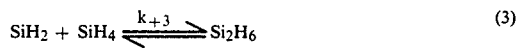

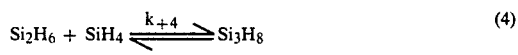

It has been confirmed by Neudorf, Jodham and Strausz, J. Phy. Chem., Vol. 84 pp 338–339 (1980), and Newman, O'Neal, Ring, Leske and Shipley, Int. J. Chem. Kin., Vol. XI, pp 1167–1182 (1979) that this mechanism is operative for the initial part of the reaction. The Arrhenius parameters of these reactions are shown in the following table taken from a more recent study by Ring and O'Neal, "Kinetics and Mechanism of Silane Decomposition," The Science of Silicon Material Workshop, Phoenix, Ariz. (1982):

TABLE 1

| Arrhenius Parameters for Silane Decomposition | | |
| --- | --- | --- |
| Reaction | $\log_{10} A$ | $E_{act}$(MJ/kmole) |
| 2 | 15.5 | 249.6* |
| −3 | 14.4 | — |
| +3 | 10.3 | 4.186 |
| −4 | 15.7 | 222 |
| 5 | 15.3 | 230 |
| 6 | 14.7 | 206 |
| Pressure | Temperature (°k.) | |
| (torr) | 650 | 710 | 1050 |
| 80 | 0.15 | 0.12 | 0.01 |
| 400 | 0.36 | 0.30 | 0.03 |
| 4000 | 0.73 | 0.67 | 0.16 |

*The parameters are for the high pressure limit ($k_\infty$). The actual value of $k_1$ depends on pressure and temperature. The following chart gives the ratio $k_1/k_\infty$.

The later stage of the reaction mechanism is not well understood. During this stage, the decomposition of disilane and trisilane are expected to become important. The following mechanisms have been proposed for these decomposition reactions.

$$Si_2H_6 \xrightarrow{k_5} Si_2H_4 + H_2 \quad (5)$$

$$Si_3H_8 \xrightarrow{k_6} SiH_4 + SiH_3SiH \quad (6)$$

The kinetic parameters of these reactions are also shown in the table above.

Above 500° C., the polyhydrides of silicon tend to decompose to silicon and hydrogen (see A. G. MacDiarmid, *Adv. Inorg. Chem. a Radiochem*, Vol. 3, pp 207-251 (1961). Of particular interest in the later stages of silicon pyrolysis is the solid product $(SiH_x)_n$ where $0<x<2$. This could be a mixture of $(SiH_2)_n$, $(SiH)_n$ and silicon. Purnell and Walsh, supra, theorized that the solid product is formed by the successive insertion of $SiH_2$ in the lower silanes which then diffuses to a surface. This would involve the following mechanism:

$$SiH_2 + (SiH_2)_{n-1} \rightarrow (SiH_2)_n \quad (7)$$

$$SiH_2 + Si_{n-1}H_{2n} \rightarrow Si_nH_{2n+2} \quad (8)$$

At large values of n the above two formulae become experimentally indistinguishable.

Ring and O'Neal, supra, have proposed that, during the later stages of the reaction, heterogenous mechanisms become important and reaction occurs at the wall surfaces of the reaction vessel. They proposed the following additional reations:

$$SiH_2 \rightarrow Wall\text{-}SiH_2 \quad (9)$$

$$SiH_2\text{-}Wall \rightarrow Wall\text{-}SiH_2* \quad (10)$$

$$Wall\text{-}SiH_2* + SiH_4 \rightarrow Wall\text{-}SiH_3 + SiH_3* \quad (11)$$

$$SiH_3* + SiH_4 \rightarrow Si_2H_6 + H* \quad (12)$$

$$H* + SiH_4 \rightarrow H_2 + SiH_3* \quad (13)$$

$$SiH_3* + SiH_3* \rightarrow Si_2H_6 \quad (14)$$

These additional reactions initiate $SiH_3*$ radical formation, which then reacts with additional silane. This may explain the observed increase in reaction rate in the final stages of the pyrolysis.

If surface reactions are important, the formation of the aerosol may become important to the kinetics of the system, since it would provide a surface for the reactants. No study of this aspect of the silane pyrolysis has been made to date. It is possible that surface reactions on aerosols could explain the difference in silane decomposition rates that have been observed by different authors in the later stages of the reaction.

From the above discussion it is obvious that the final stages of silane pyrolysis are uncertain. However, most of the dynamic processes in the aerosol reactor occur before a significant amount of condensation has occurred. If nucleation can be controlled during this period, control in the later stages follows quite easily. Surface reactions will enhance the particle growth rate and minimize the risk of further nucleation. The important reaction is, therefore, the initial silane decomposition reaction. The rate of silane consumption is:

$$\rho_g d([SiH_4]/\rho_g)/dt = -k_1[SiH_4] \quad (15)$$

The rate constant $k_1$ depends on temperature as well as pressure, and at atmospheric pressure, this constant can be approximated by:

$$k_1 = (0.96 - 8.735 \times 10^{-4} T) \exp(35.69 - 30024/T) \text{ sec}^{-1} \quad (16)$$

Equation (15) is valid in the temperature range of 650° K. to 1050° K.

To determine the clearance volume of the aerosol in this system, it is required to determine whether the condensing species is a polysilane, $Si_nH_x$, or silicon, and whether surface reactions are important in the process. Studies of silane pyrolysis have not addressed this issue. In the absence of better information, it is assumed that silicon is the condensing species. Since silicon will have much lower vapor pressure than a condensing polysilane and surface reactions will promote aerosol growth, it is clear that the worst case is being considered.

With the above assumption, the parameters for aerosol evolution in the flow reactor are shown in the following table:

TABLE 2

| Parameter | Value | Parameter | Value |
|---|---|---|---|
| $\Delta H_v/R$ | $9.9 \times 10^4$ | $\sigma$ | 0.87 N/m |
| Le | 1.1 | p | 101.3 kPa |
| $\beta$ | 3.1 | $c_d$ | 82.7 Kmole/m$^3$ |
| $\gamma$ | 3.7 | $R/M_B c_p$ | 0.28 |

$P_{sat} = 133.4 \exp(25.232 - 55894./T)$ Pa

These values are for a system where a small amount (1% to 10%) of silane in nitrogen is pyrolyzed. For parameters which vary with temperature, the value at 800° K. has been taken. The vapor pressure expression has been obtained by extrapolation of an experimental vapor pressure curve.

The assumptions made in obtaining the parameters are somewhat extreme. It is important to note that the method for producing large aerosol particles will remain the same irrespective of the values of physical properties of this system. There must be a small amount of seed aerosol, and a controlled, slow reaction rate to promote seed growth and prevent nucleation.

Figure 5:
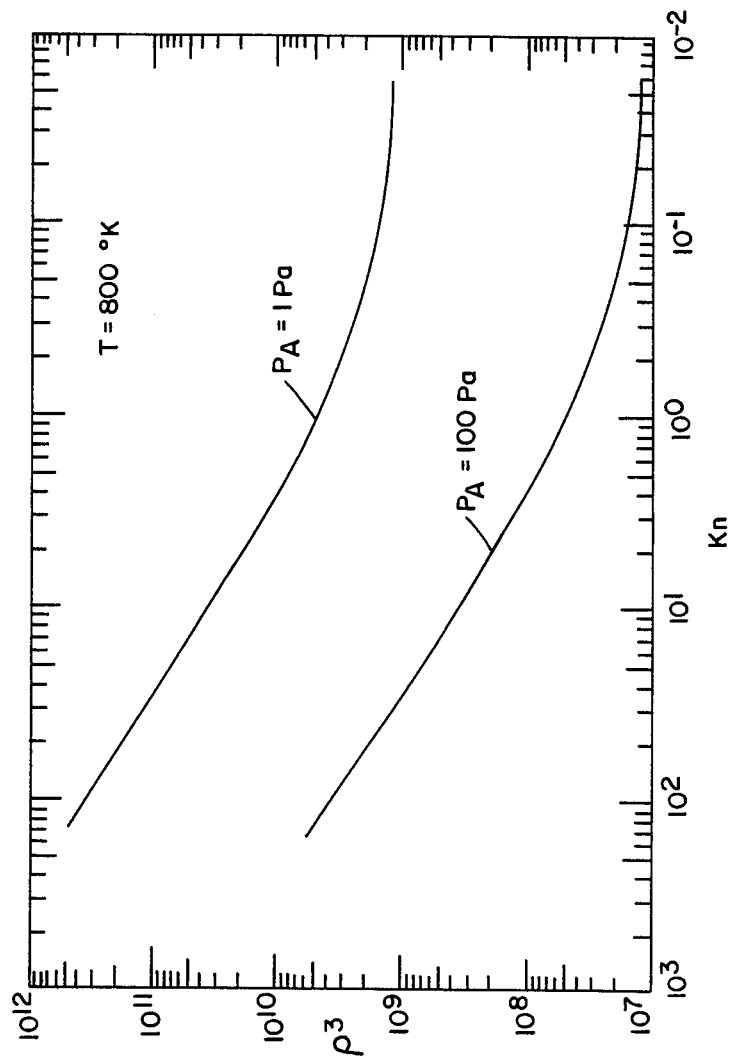
FIG. 5 is a dimensionless graph of clearance volume, $\rho^3$, for silicon as a function of Kn, the ratio of $2\lambda/D$, where $\lambda$ is the mean free path between molecule collision. It shows Kn decreasing as clearance volume increases, i.e., as the diameter, D, of particles increases. $P_{si}$ is the partial pressure of silicon vapor, and Pa is pressure in Pascals.
Figure 6:
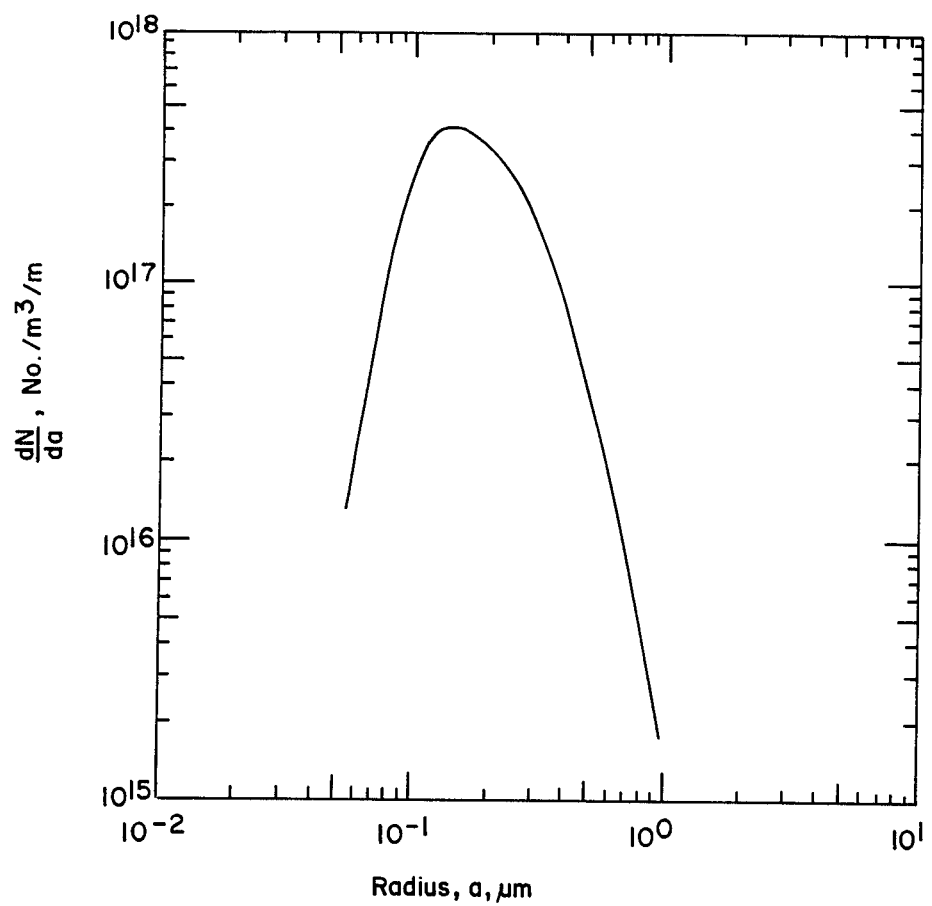
FIG. 6 is a graph of size distribution of seed aerosol in which the ordinate is the derivative of the number concentration of particles with respect to radius, a, and the abscissa is the particle radius in micrometers.

The dimensionless clearance volume of silicon aerosol was calculated on the basis of the parameters in Table 2 and the results are plotted in FIG. 5. The behavior of $\rho^3$ (clearance volume per particle volume) as a function of Knudsen number, Kn, is similar to that of the H$_2$O aerosol system. The plots of $\rho^3$ can be correlated by the following analytical expression:

$$\rho^3 = 5.95 \times 10^6 (1 + 3.1 Kn)(T/P_A) \quad 600° K. < T < 1100° K. \quad (17)$$

where $P_A$, the partial pressure of silicon particles, is itself a function of the temperature T.

The kinetics of silane decomposition can now be integrated into the model of simultaneous nucleation and particle growth to simulate the silicon free-space reactors and to identify operating conditions which would allow growth of large particles. The first case to be considered is the flow reactor operated at high temperature (high reaction rate) with no seed aerosol. When 20% silane is pyrolyzed in this system at 875° K., nucleation occurs almost instantly, producing $1.17 \times 10^{17}/m^3$ particles before nucleation is quenched. The nucleated particles then grow by deposition of vapor. These seed particles grow to a size of about 0.12 micron. In fact, reactions carried out for conditions under which substantial nucleation occurs give a product between 0.05 and 0.3 micron in size, as observed in the prior-art flow reactors.

A flow reactor for the growth of large silicon particles by silane decomposition requires a much slower reaction rate than was achieved in the free space reactors. Because of the extreme reactivity of silane gas and for reasons of conversion efficiency, the amount of silane in the gases leaving the reactor should be kept very small. Thus, it is desirable to accelerate the reaction to ensure complete conversion within the reactor. To do this, reactor wall temperature may be increased along its length, as shown by the dashed line in FIG. 4. In general, the temperature profile in the reactor may be written as a function of position, z, along the axis (length) of the reactor, as follows:

$$T = f(z) \tag{18}$$

The point $z=0$ is chosen where the silane reaction is negligible. In the present experimental system, this was taken to be at a temperature $T_i = 775°$ K. The end point for the system is at time $t = t_f$ when the aerosol flow reaches the point $z = L$ in the reactor, the total length L. The temperature at this point is $T_f$.

It can be shown that the temperature profile in the reactor as a function of time is given by:

$$t = \frac{\pi d^2 T_i}{4 U_i} \int_0^T \frac{dT}{T\left(\frac{df}{dzT}\right)} \tag{19}$$

where $U_i$ is the volume flow rate at $z=0$ and d is the diameter of the reactor tube.

The temperature profiles chosen for the reactor were of the form:

$$T = T_i \sqrt{1 + C_o z} \tag{20}$$

$$\text{where } C_o = \frac{1}{L}\left\{\left(\frac{T_f}{T_i}\right)^2\right\} - 1 \tag{21}$$

The above equation can be substituted in Eq. (19) to find:

$$T = T_i\left[1 + \frac{2 C_o U_i}{\pi d^2} t\right] \tag{22}$$

i.e., the temperature profile is linear in time and parabolic along the length of the reactor. The total residence time in the reactor is then given by:

$$t = \left(\frac{T_f}{T_i} - 1\right) \frac{\pi d^2}{2 C_o U_i} \tag{23}$$

The temperature profile was not chosen to be the optimum for the reactor, but was selected for the simplicity with which it could be implemented in the experiments and simulations. A set of parameters for the experimental system is shown in the following table:

TABLE 3

Temperature Parameters for Experimental Silicon Reactor

| Parameter | Value | Parameter | Value |
|---|---|---|---|
| L | 0.37 m | $t_f$ | 0.98 sec |
| $T_i$ | 775° K. | $U_i$ | $2.2 \times 10^{-5}$ m³/sec |
| $T_f$ | 1100° K. | d | 0.0095 m |
| $C_o$ | 2.7424 | $U_i$ | 0.3104 m/sec |

$$T = 775 \sqrt{1 + C_o z}$$

Figure 7:
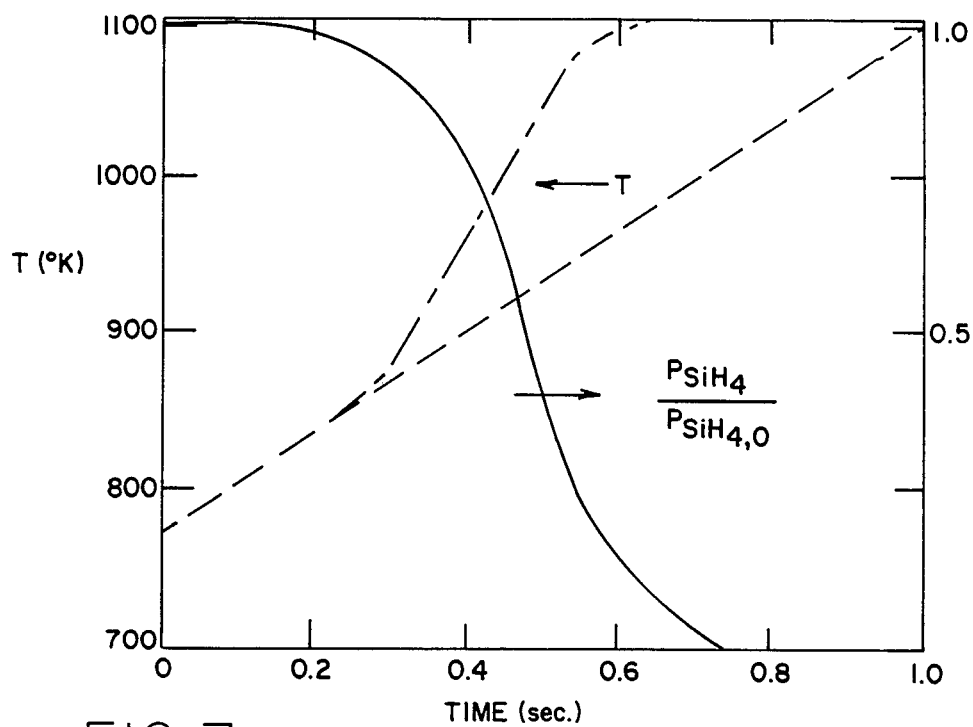
Figure 8:
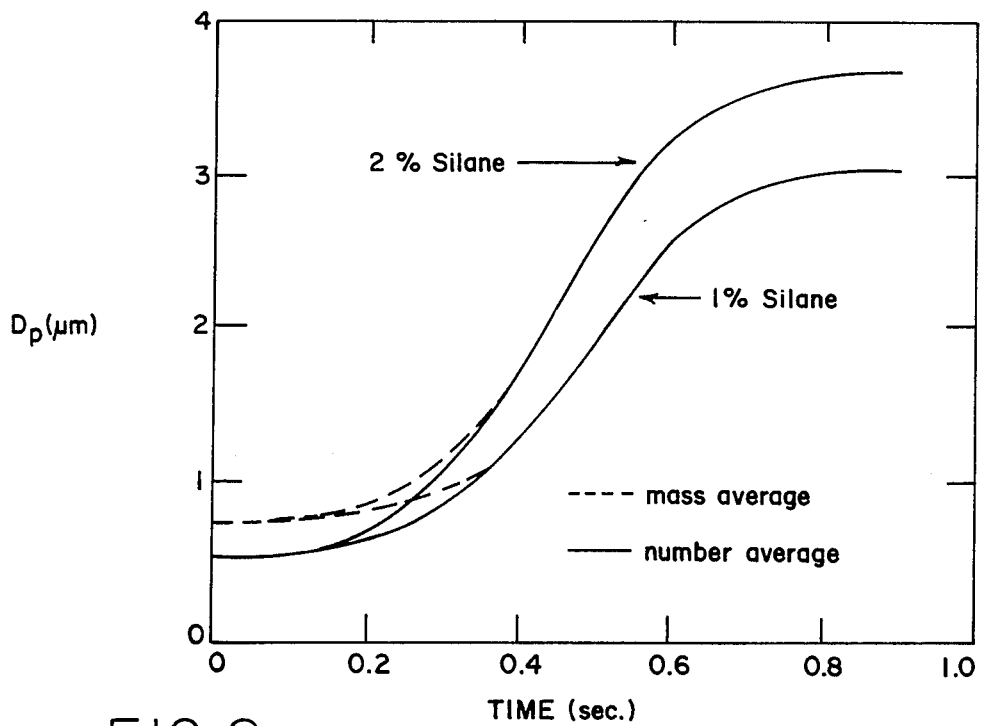
FIG. 8 is a graph of particle diameter, $D_p$, as a function of time showing predicted growth in the silicon aerosol reactor for two concentrations of silane (1% and 2%).
Figure 9:
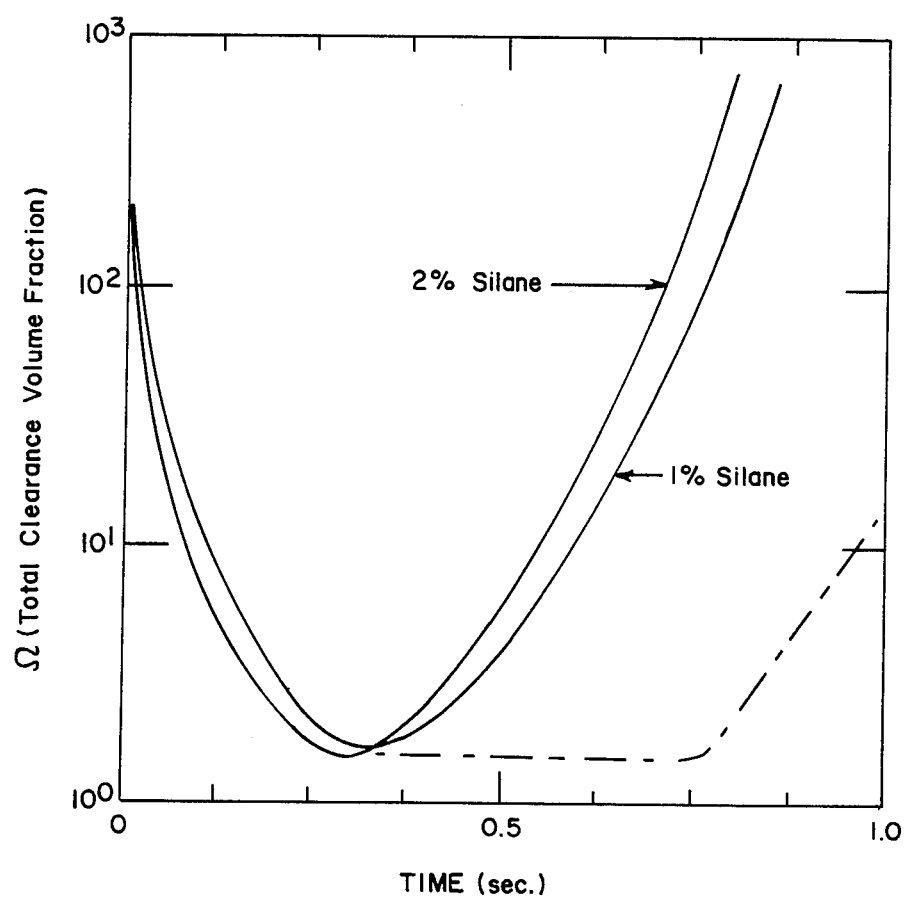
FIG. 9 is a graph of predicted total clearance volume fraction in the reactor for two concentrations of silane (1% and 2%) using the linear temperature profile of FIG. 8. The dashed-dot line indicates how the total clearance volume might be changed for the optimized temperature profile of FIG. 8.
Figure 10:
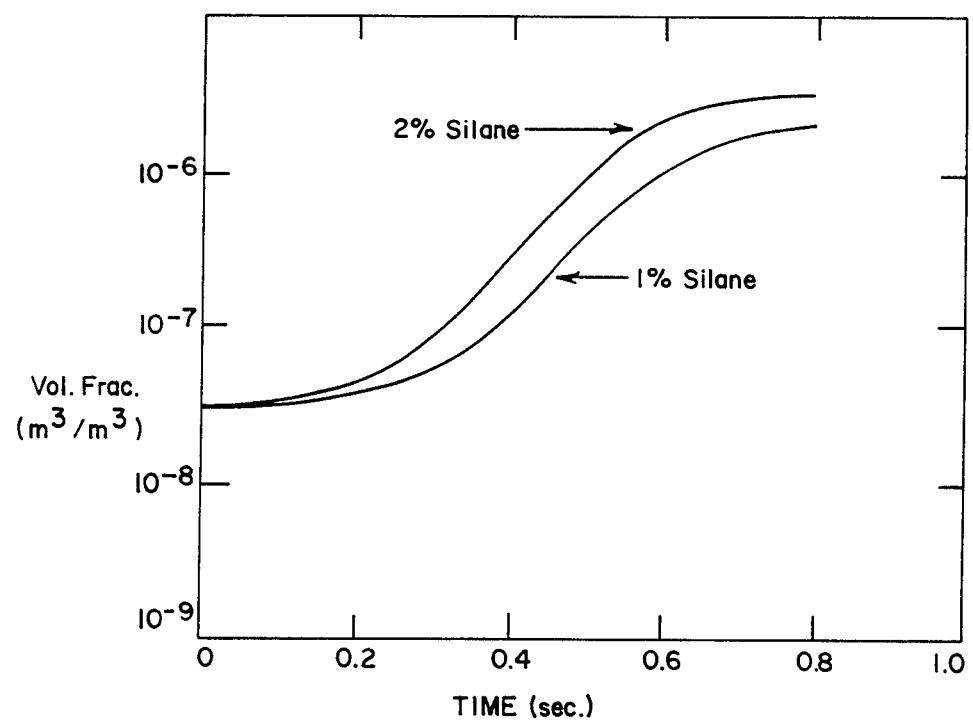
FIG. 10 is a graph of the predicted volume fraction of particles for the two concentrations of silane, assuming the linear temperature profile of FIG. 8.

FIGS. 6–11 show the calculations for a simulation of the experimental free-flow reactor in which 1% to 2% silane is reacted in the presence of seed aerosol. The temperature profile for this calculation is given by the parameters in Table 3 above. The seed aerosol size distribution for this simulation shown in FIG. 6 was obtained from experimental data to be discussed below. The seed is a submicron aerosol very similar to the product obtained in the prior-art high-rate reactors; but the number concentration was reduced by a very large factor. FIG. 7 shows the temperature and the kinetics of the reaction in the reactor as a function of time. The total residence time in the reactor is approximately 1 sec. During the initial period (t<0.3 sec), very little reaction occurs, and the seed particles grow to about 0.5 micron, as shown in FIG. 8. As the particles grow in size, they become more efficient in scavenging the silicon vapor, and the faster reaction rate, which is a function of temperature, does not result in nucleation. The mean diameter of the product is 3.01 microns with 1% silane and 3.7 microns with 2% silane. This is a sufficiently large size for collection by inertial deposition or, perhaps, by sedimentations. FIG. 9 shows the total clearance volume fraction as a function of time. As the aerosol volume fraction increases FIG. 10, the condensation process finally dominates the reaction rate, and the total clearance volume fraction goes up steadily. In the final stages very little silane is left; the high temperatures in this burnout region serve mainly to react all traces of silane.

Some silane is expected to be lost to the walls due to surface reactions. The rate constant for the surface reaction was found by Iya, et al., Journal of the Electrochemical Society, Vol. 129 pp 1531–1535 (1982), to be:

$$k = 5.14 \times 10^9 \exp(019526.9/T) \text{ sec}^{-1} \tag{24}$$

Figure 11:
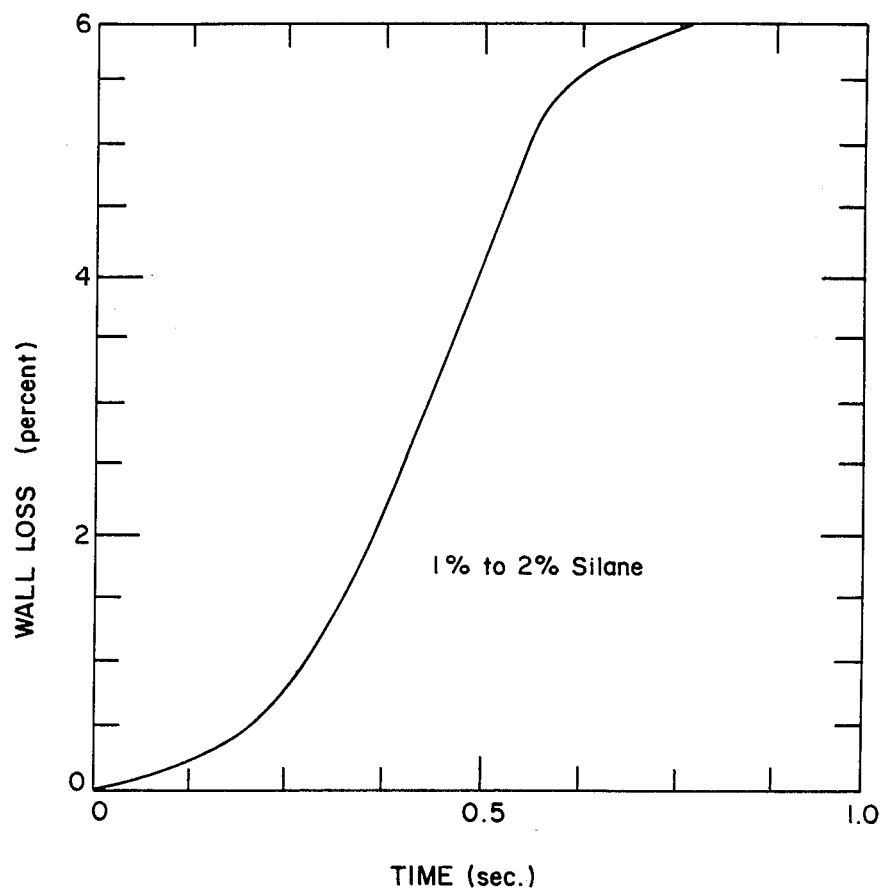
FIG. 11 is a graph of the predicted percentage wall losses due to reaction on the reactor wall surface for the two concentrations of silane.

Surface reaction rates have been incorporated in the simulation. FIG. 11 shows the losses due to wall reaction. About 6% is lost to the walls when 1% silane is reacted and this fraction remains the same when 2% silane is reacted.

Figure 12:
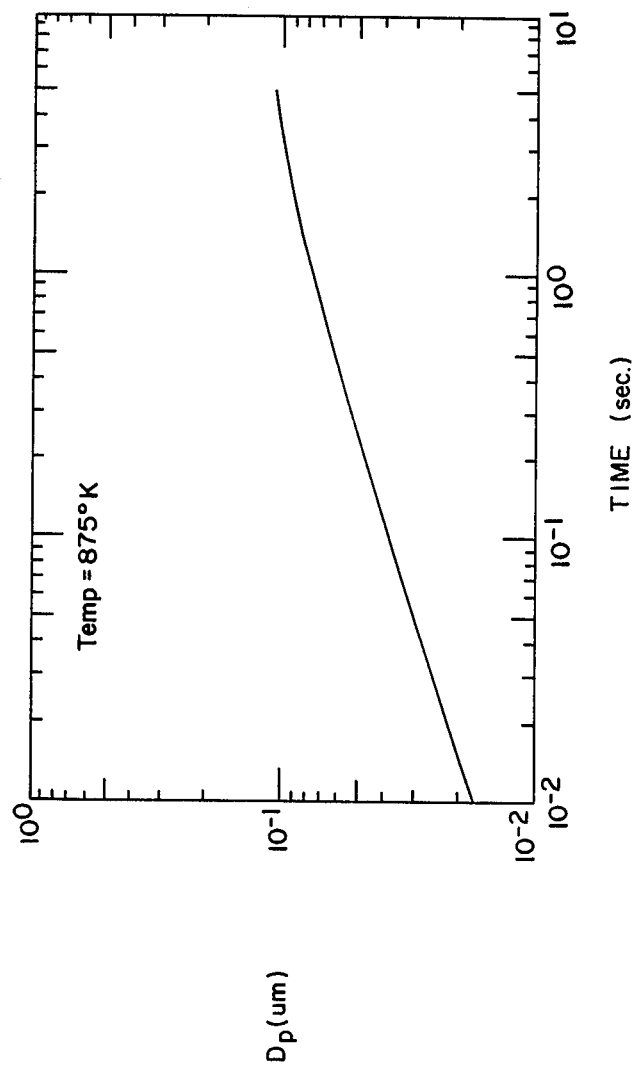
FIG. 12 is a graph of predicted particle diameter as a function of time showing growth in a conventional (uncontrolled reaction) free-space reactor.

These calculations suggest that the controlled-rate flow reactor can grow substantially larger particles than were produced in the prior-art high (uncontrolled) rate reactors. The particle growth by conventional free-space reactors having a high uncontrolled rate of reaction is shown in FIG. 12 for comparison with calculated particle growth shown in FIG. 8 for the reactor controlled in accordance with the present invention. The experimental system developed to test these calculations will be discussed below, but first it is important to note that these calculations do not take into account particle growth incidental coagulation and the variation of the reaction rate, hence growth, with radial position in the reactor. Consequently, the size range of particles may be broader than these calculations indicate. It should also be noted that the calculations are for a system that has not been optimized. The temperature profile for an optimized system would be nonlinear, generally as shown by a dashed-dot line in FIG. 9 in order to achieve a total clearance volume fraction in the reactor generally as shown by a dashed-dot line in FIG. 9.

From the horizontal calculations of simultaneous nucleation and condensation, it is clear that an aerosol reactor for production of large particles of silicon must have a low number concentration seed aerosol, low enough that substantial growth of the seed is possible, and a reaction rate controlled to minimize the nucleation rate while the seed aerosol is grown. The wall temperature along the length of the free-flow reactor may be varied to control the reaction rate. From the simulation calculations described above, the initial temperatures may be as low as 775° K., and increased linearly to as high as 1100° K. for a transit time through the reactor of seed particles of only one second. At these low temperatures, the rate of vapor production is slow enough to be scavenged by the aerosol. An experimental system incorporating these features and using a seed reactor as shown in FIG. 3 was operated to demonstrate the feasibility of controlled growth of silicon particles.

An important consideration in the design of the experimental reactor was the fact that silane is a highly reactive toxic gas. It burns spontaneously in contact with air or oxygen, producing silica ($SiO_2$):

$$SiH_4 + O_2 \rightarrow SiO_2 + 2H_2O \tag{25}$$

In order that no silica be formed in the system, all gases introduced into the experiment had to be free of oxygen. All joints were, therefore, regularly tested for leaks. Nitrogen, which was used as a diluent gas, was cleaned of oxygen by passing it through a purging unit. The purging unit consisted of a stainless steel vessel containing copper turnings and maintained at a temperature of 400°–450° C. Quartz reactor tubes and mixing sections were connected by vacuum o-ring joints. At the start and the end of every experiment, the system was put through a number of cycles in each of which it would be first pressurized with pure nitrogen and then evacuated with a vacuum pump. Finally, a constant flow of nitrogen was maintained through the reactor for the duration of the experiment.

Because of the extreme care necessary in the handling of silane, the experiment was designed to use small quantities of silane. The reactor tube inside diameter was 9.5 mm. To minimize loss of aerosol by sedimentation, the primary reactor flow was actually directed vertically downwards by having the upward flow out of the seed reactor turned 90°, and after introducing and mixing silane and a carrier gas, having the flow turned 90° into the downward flow primary reactor.

Because the temperature must increase along the length of the reactor, buoyancy induced flow instabilities are a potential problem. If the flow momentum is greater than the buoyancy force, this problem can be overcome. This requires that $g_a \Delta T d / u^2 T < 1$, where $g_a$ is the acceleration due to gravity, $\Delta t$ is the temperature difference, d is the diameter of the reactor tube and u is the mean velocity of gases in the reactor tube. In the seed generator, the flow velocities are too small for this condition to hold. Fortunately, the degree of control required of the seed generator is not as severe as for the primary reactor. Furthermore, the particles in this reactor are too small for sedimentation to be significant. Consequently, the seed aerosol reactor was designed for a vertically upwards flow with buoyancy effects dominating the flow.

The seed aerosol must be uniformly mixed throughout the gases entering the primary reactor so that particle-free pockets of fluid do not lead to homogenous nucleation of new particles and the disruption of the process. Seed particles are expected to be in the submicron range. These particles are too big for effective mixing by brownian motion within a reasonable period of time. Static mixing units were used to provide rapid mixing within a small volume. A significant amount of the said aerosol is lost in the mixing zone, but this amount is extremely small compared to aerosol production in the primary reactor. Since these losses do not significantly influence the efficiency of the process, they have been tolerated in the design of the experimental system.

The seed reactor and the primary reactor share a common basic design and construction. Each is made up of a 9.5 mm i.d. (11 mm o.d.) quartz tube. The seed aerosol reactor has a 12 cm long heating zone. This stage is connected to the primary reactor through the mixer (pyrex tube, 16 mm i.e., 40 cm long). Pure silane with carrier gas (nitrogen) enters the mixing tube around the seed aerosol. The mixer tube contains 16 static mixing elements (Luwa static mixer, $\frac{3}{8}$ inch o.d.) in series, and these elements mix the seed aerosol, silane and the carrier gases into a homogeneous two phase flow. This flow then enters the primary reactor tube (50 cm long). Leak tight connections between these sections are made through 'o' ring flanges and viton 'o' rings.

The seed aerosol generator is heated by a small resistance type split furnace containing a 5 cm long (5.5 cm i.d.) heater element (Thermcraft). The heater is capable of delivering 200 watts at 28 volts. The heater is enclosed in an insulated firebrick housing surrounded by a water cooled metal cover. Cooling is done by flowing water through cooling coils soldered on the metal cover. This feature reduces the time for the furnaces to reach steady state.

Figure 13:
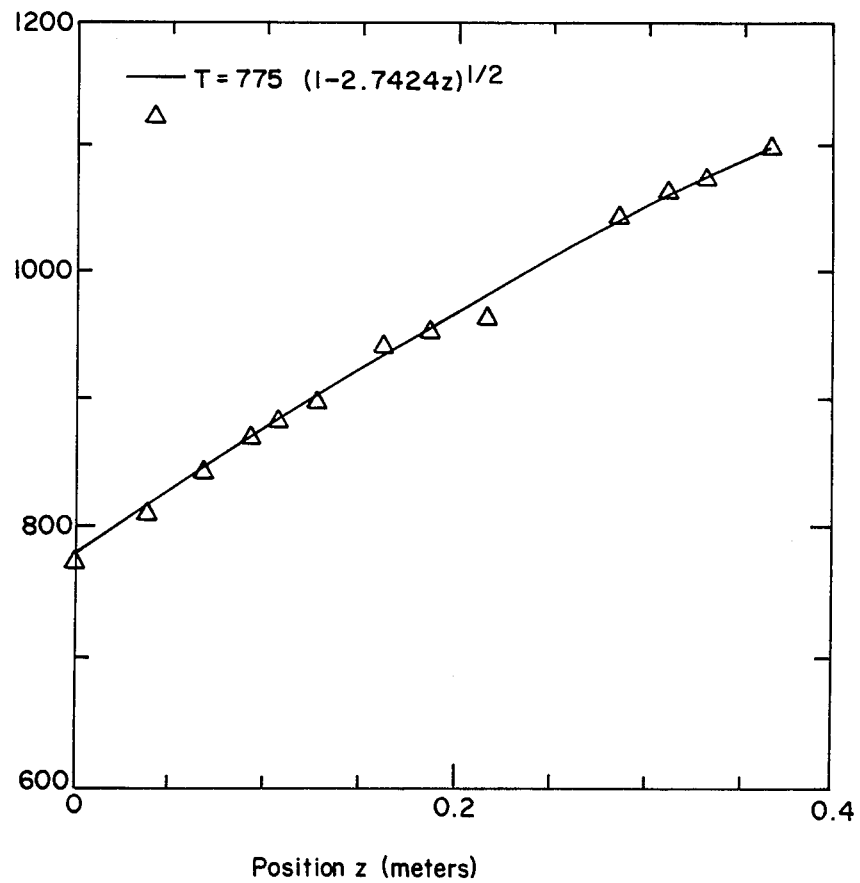
FIG. 13 is a graph of measured temperature along the length, z, of the reactor, and of the desired temperature profile.
Figure 14A:
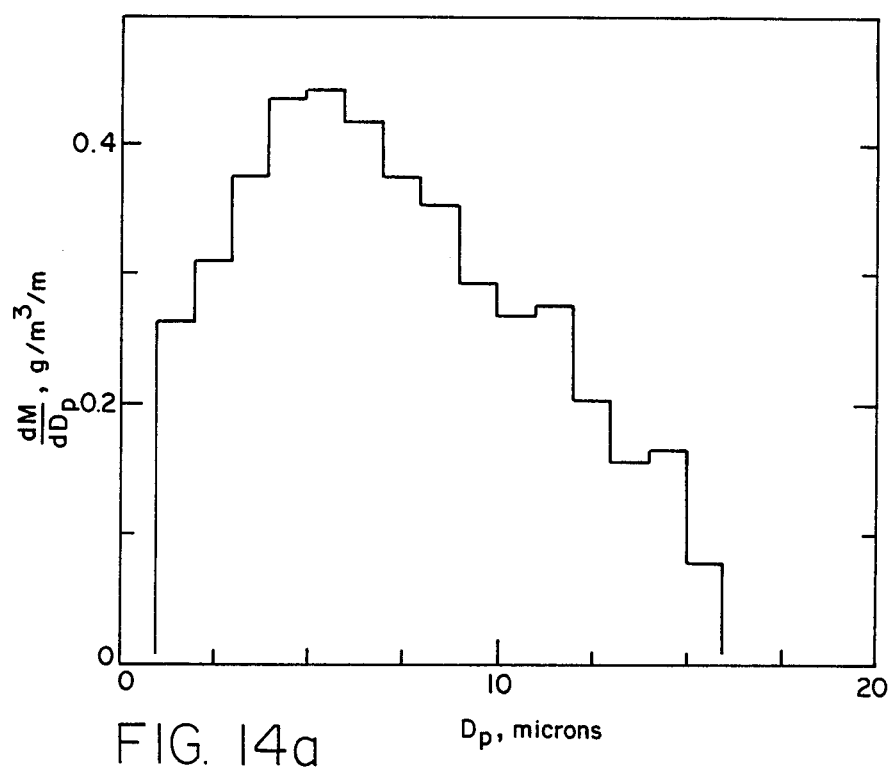
FIG. 14a is a graph of the measured mass distribution of aerosol after reacting 1% silane in the presence of seed aerosol (total seed concentration $= 1.02 \times 10^{11}/m^3$). The diameter of the particles, Dp, is given in microns.
Figure 14B:
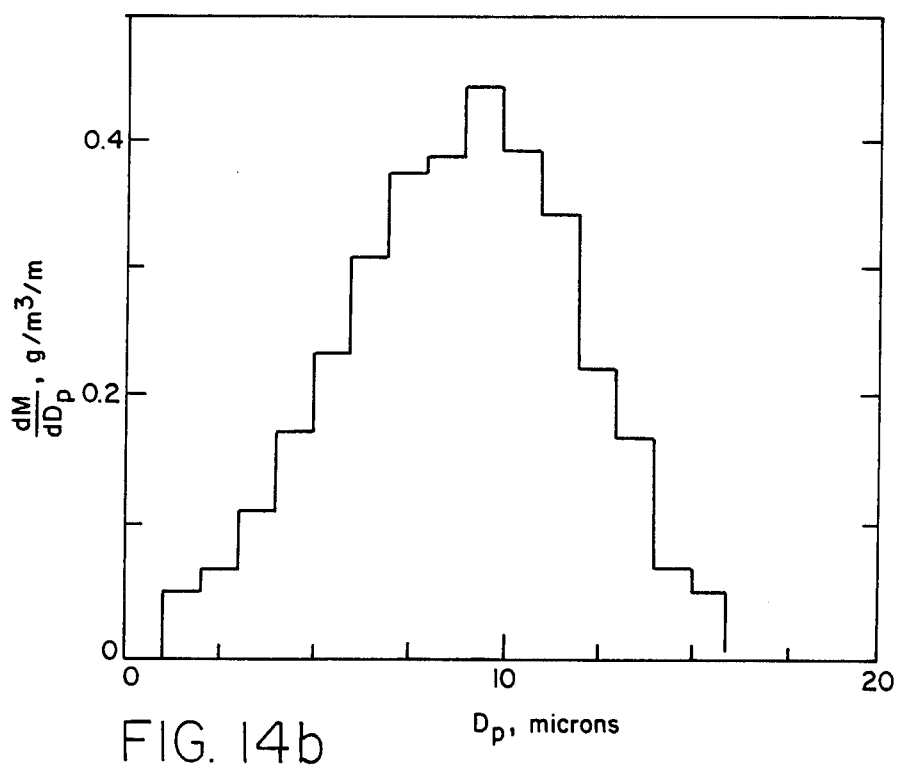
FIG. 14b is a graph of the measured mass distribution of aerosol after reacting 2% silane in the presence of seed aerosol (total seed concentration $= 1.02 \times 10^{11}/m^3$). The diameter of the particles, Dp, is given in microns.
Figure 15:
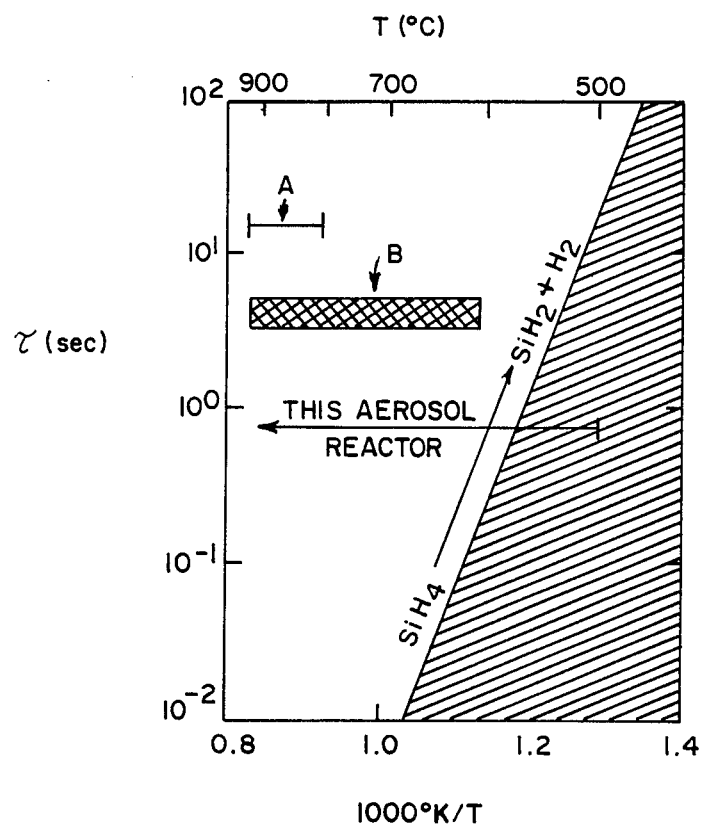
FIG. 15 is a graph comparing the characteristic times of the silane reaction in two prior-art free-space reactors A and B and the aerosol reactor of this invention having its reaction controlled by a linear temperature profile.

The primary reactor is heated by a five zone furnace. Each zone furnace contains three heating elements identical to the one in the seed aerosol reactor furnace described above. The heater elements are separated from each other by zirconia insulation plates. This minimizes the effect of each zone on the neighboring one, and allows effective temperature variation in the furnace from zone to zone. The primary reactor has 14 thermocouples cemented along the length. Five of these are used as sensors for feedback to control units. Each heating element is powered through a temperature control unit. These control units were designed to vary the power to the element by varying the input voltages from 0 volt DC to 28 volts DC. FIG. 13 shows the desired temperature profile and the actual temperatures in the reactor.

A flow controller (Porter Instruments, DFC 1400; 10 cc/min flow element) was used to control the flow of 1% silane into the seed aerosol generator. This flow is introduced at the center of the seed reactor tube and around this flow pure nitrogen is introduced coaxially through a Tylan FC 260 flow controller. The flow of nitrogen reduces the residence times in the seed generator and decreases wall reactions.

The flow of the seed aerosol then enters the mixer tube. At the same point a mixture of silane and nitrogen enters the mixer tube coaxially around the seed aerosol flow. The new silane forms about 1% of the total flow and is metered by a Porter Instruments DFC 1400 flow controller. The gases and the aerosol are well mixed in the mixer and then they enter the primary reactor.

The typical flows and residence times in this system are shown below:

(a) Seed aerosol reactor:
  1% silane in nitrogen: 5–20 cm/min
  Pure nitrogen: 5–10 cc/min
  Residence time: 10–25 secs
  Temperature: 900° K.

(b) Mixer tube
  Seed aerosol flow: 10–30 cc/min
  Primary silane flow: 5–20 cc/min
  Primary nitrogen: 0.5–2 l/min
  Residence time: 3–4 secs (c) Primary Reactor: The inlet flows are the same as in the mixer tube.
  Residence time: 1 sec
  Reynolds number: 114
  $g_a \Delta Td/(u^2T)$: 0.2
  Temperature: 750° K. to 1100° K.

The flow at the exit has no silane left.

The product coming out of the reactor was silicon aerosol at a very high temperature (approx. 1100° K.). The aerosol concentration was also extremely high and was therefore cooled and diluted before sampling. A dilution system was developed to both dilute and cool the aerosol with minimum losses. As the aerosol leaves the reactor, a coaxial flow of carrier gas of equal magnitude, but much less momentum, was introduced from the sides of a sintered tube through which the aerosol flowed. This prevented the aerosol from coming in contact with the colder walls and depositing due to thermophoresis. Further downstream, a large flow of diluent gas with much higher momentum was introduced coaxially into the aerosol flow and in the same direction. The total flow rate was such that the flow became turbulent and the aerosol then mixed with the gases. This caused dilution and cooling to occur simultaneously.

Sampling of the aerosol was done by an Electrical Aerosol Size Analyzer (Thermo-Systems Inc., Model 3030, a Royco Model 226 Laser Optical Particle Counter and a Classical Scattering Optical Particle Counter, Particle Measurement Systems, Model CASP-100-HV (SP)).

Most of the experimental results described below were carried out in the reactor with operating parameters given in Table 3. The only exception was one run in which the temperature was kept constant and the reaction was not controlled.

FIG. 14*a* and FIG. 14*b* show the mass distributions measured with the Classical Scattering Optical Particle Counter. The seed aerosol for these runs had a number concentration of $1.0 \times 10^{11}/m^3$. The seed aerosol size distribution was obtained by inverting the data from an Electrical Aerosol Size Analyzer with the algorithm developed by Crump and Seinfeld, Aerosol Sci. and Technology, Vol. 1, No. 1, pp 14–34 (1982). The product has a mass mean diameter of 3.5 microns (mass median diameter: 6.2 microns) when 1% silane is reacted and 5.0 microns (mass median diameter: 9.0 microns) when 2% silane is reacted. The product was predicted to have a mass mean diameter of 3.0 microns for the case of 1% silane and 3.7 microns in case of 2% silane. It must be noted here that the theory predicts a monodisperse aerosol, whereas the product is certainly polydisperse. As was mentioned earlier, this is mainly due to radial variations in the reactor and incidental coagulation of the aerosol, none of which have been accounted for in the theory. The incidental coagulation would increase the size of some of the particles above that predicted by theory. Elemental analysis of the product by this process revealed that it is mainly silicon with less than 5% hydrogen.

Finally, the mass of product was collected by a total filter to determine the loss of silicon (both as silane and silicon) in the furnace. About 73% of silicon is recovered when 1% silane is reacted. The recovered fraction is less when silane concentration is increased. The losses include deposition in the dilution and cooling systems which are outside the reactor. When 1% silane is reacted, about 6% of the silane was predicted to be lost due to reaction on the wall. Experimentally about 10% of the silicon is lost in the dilution system, so as much as 17% of the silicon may have been deposited on the reactor walls.

The feasibility of growing large silicon particles by silane pyrolysis has been demonstrated by this experimental system. The main difference between the present invention and the conventional free-space reactors is illustrated in FIG. 15 where the characteristic times of different conventional reactors A and B is compared with the characteristic times for the present invention. The A and B reactors operate at high temperatures where the reaction is extremely fast. This leads to nucleation of the vapors and the product is a submicron aerosol. The reactor discussed here operates under controlled reaction rates and condensation predominates. The temperatures in the aerosol reactor increase with time, but slowly enough such that the aerosol is at all times able to scavenge the vapors.

The experimental data indicate that the results from the reactor described are in reasonable agreement with theory when nucleation is significantly quenched for large particle growth, and when the same system is instead run as a conventional high temperature, free-space reactor without quenching nucleation for comparison. The main reasons for differences between theoretical predictions and experimental results are probably the radial variations in the reactor and coagulation of the aerosol. Coagulation is specially significant when large numbers of particles are expected to nucleate and it leads to additional growth of seed particles, which is the technique used by Friedlander discussed as part of the background of the present invention. An improved analysis would, therefore, include the effect of coagulation in the system. The radial profiles in the reactor should also be taken into account. The coagulation calculations must include both that due to brownian motion and that due to differential sedimentation. The analysis would be more complex than that which has been undertaken, but the conclusion would be the same, namely that controlling the seed particle concentration and the rate of reaction promotes particle growth by a mechanism that does not rely upon coagulation.

A significant improvement over the experimental system would be to enlarge the reactor to obtain particles large enough to be collected easily by gravitational settling. It would then be possible to incorporate a collection crucible into the system in which the particles are melted. The reactor would then be able to produce silicon melt in one operation. The melt could be processed to grow single crystals by conventional methods.

The experimental system utilized silane for production of silicon. The technique can be applied to other gaseous reactants. All that is required is a knowledge of the decomposition mechanism for other gaseous recactants comparable to Equations (1) through (16) above to determine the parameters available to quench nucleation and control the rate of reaction, thereby to promote the growth of particles by deposition of material on seed particles. The development of the experimental reactor was made possible by analyzing the process of simultaneous nucleation and condensation for particles in the free molecular, transition and the continuum size ranges. The analysis is a modification of the classical theory, and appears in the theory as the total clearance volume fraction $\Omega$. As long as $\Omega << 1$, the two approaches are identical. As $\Omega$ becomes of the order unity, the theories diverge. The present analysis was carried out by considering simultaneous nucleation and diffusion around a single particle and then summing up the individual effects for all particles. The effect of the influence of adjacent particles was ignored. As the volume of influence of adjacent particles overlap, the relation between average vapor pressure, as used in the classical theory, and the background vapor pressure, as used in the clearance volume approach, is very difficult to define. Comparison of the two methods is not possible unless a detailed analysis of simultaneous nucleation and condensation is made by taking into account the spatial distribution of particles and overlapping regions of influence. When the clearance volume approach is used with such a detailed analysis it can provide an accurate analysis of nucleation and condensation.

Still other systems and control schemes may be devised theoretically or empirically for growing particles other than silicon. All that is required for any system is that homogeneous reaction of the gas occur in such a slow, controlled manner as to provide free molecules at a rate below that required for homogeneous nucleation of particles. The free molecules will then condense on the controlled concentration of seed particles to grow large particles. Particle growth may also proceed due to heterogenous reaction.

For a more general chemical reactor, the necessary control would be achieved in an analogous way by control of the mixture and temperature of the reactant gases and by the reactor operating pressure. In other words, the temperature profiles for a pyrolytic reactor are, in effect, reaction rate profiles because the rate of reaction of the gases is a function of temperature. To achieve the same objectives in a freespace chemical reactor to grow particles from other reactants, such as SiN, SiC, GaAs or $SiO_2$ particles, for example, or to grow silicon from other gases, the proportions, pressure and temperature of the gases mixed are selected to achieve the desired rate of reaction. Examples of reactors for growing silicon particles from other gases are:

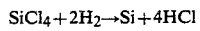

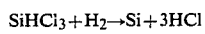

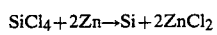

Other examples for other materials will occur to those skilled in the art. The gases may be mixed at a selected pressure while being brought up to the desired temperature in the main furnace and then allowed to react at a rate controlled in the primary reaction zone by control of temperature. Alternatively, the reaction rate may be controlled by control of pressure, or proportions of the gases, or controlled by the control of selected ones of these parameters. Consequently, it is intended that the claims be interpreted to cover chemical as well as pyrolytic reaction of gases.

Thus it can be appreciated that by controlling the concentration of seed particles mixed in a flow of reactant gas, or gases, and by so controlling the rate of reaction as to prevent formation of new particles in the reactor, particles may be grown to a large size. For optimal growth of particles of a given large size, it may be desirable to operate two or more reactors in series, rather than to make the reactor longer. Each reactor would be operated in a manner strictly analogous to the single reactor, i.e., operated with the same criteria of controlled concentration of particles mixed with a gas, or gases, and controlled rate of reaction to prevent formation of new particles while additional material is deposited on the particles.

From the foregoing, it is evident that for every known reaction, such as that shown for $SiH_4$ in Eqs. (2)-(14), there will be one identifiable slow step which can be controlled. In the given example of silane, the controllable slow step is given by Eq. (2), and the control of the step in a free-space reactor is through the reactor temperature profile, i.e., through the control of temperature and particle concentration along the length of the reactor as the silane and seed particles flow through the reactor. Although the specific experimental data given was not for an optimized reactor, but rather for one in which the temperature profile was linear, it is clear that to optimize particle growth, the total clearance volume fraction should be held at the minimum for a substantial period (i.e., over a substantial length of the reactor), as indicated by the L dashed-dot line in FIG. 9. To demonstrate this theory of optimization for silane, the results of three temperature profiles with controlled particle concentrations were calculated.

Figure 16A:
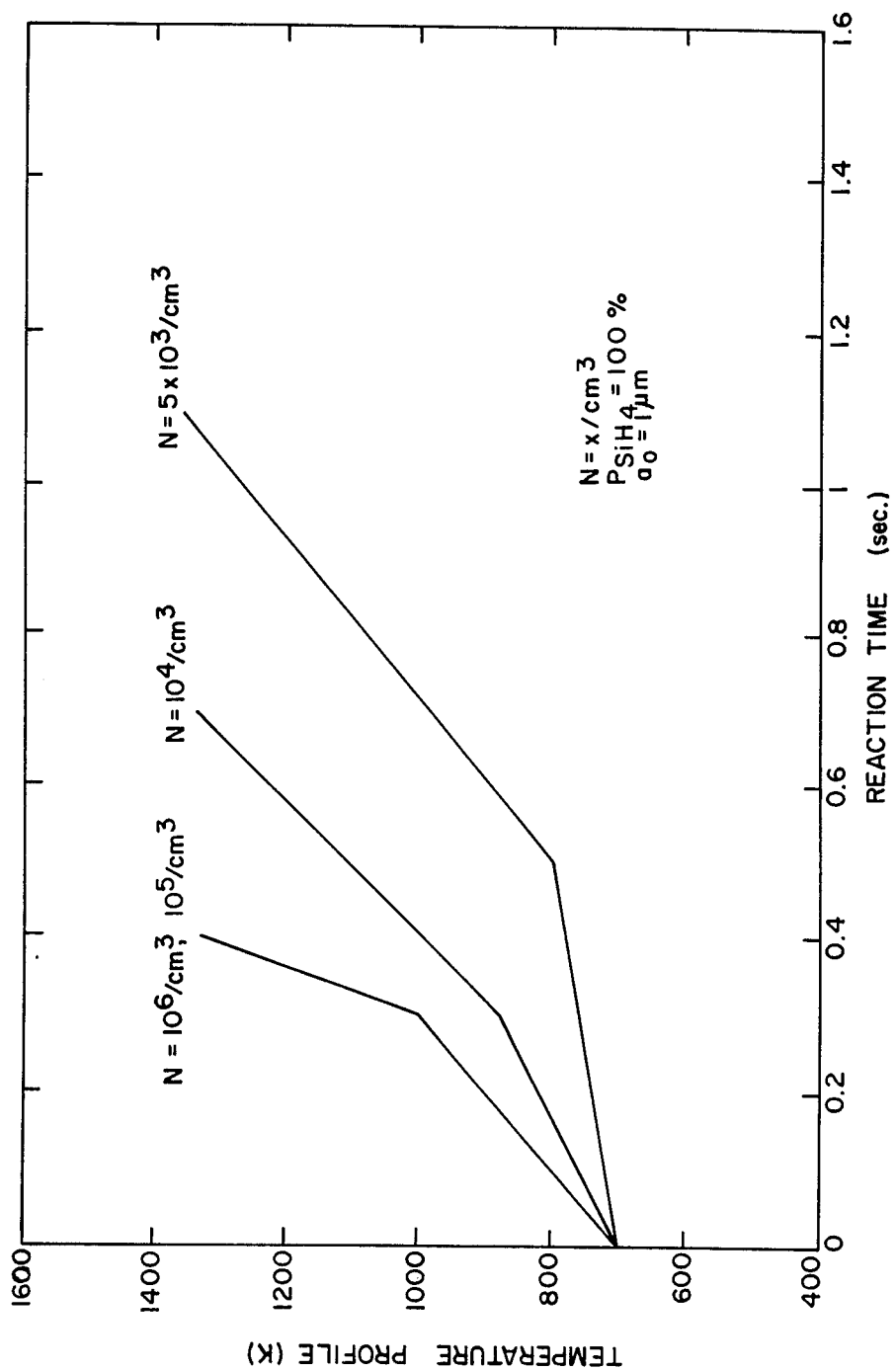
FIGS. 16a, b and c are respective graphs of three predicted temperature profiles, total clearance volume fraction at which nucleation is quenched, and final particle size (radius in micrometers) all as a function of time, which together illustrate that the suggested temperature profile shown in a dashed-dot line in FIG. 7 will the system.

FIG. 16a shows a plot of the three temperature profiles in which the rate of increase of the temperature is significantly increased, after an initial period, in order to accelerate seed particle growth while still preventing new particle formation.

The theory is that at first the seed particles are small, and therefore have little surface area on which the silicon vapor may deposit. Consequently, the reaction rate must initially be maintained low enough for the silicon vapor pressure to be at a level below that necessary for homogeneous nucleation of new particles. This is accomplished by a low rate of increase of the temperature of silane as particles are allowed to grow for an initial period. Generally the lower the particle concentration, the lower the initial rate of increase, and the longer this rate must be maintained. Then as the particles continue to grow, and the surface area on which silicon may deposit increases more rapidly, the slope of the temperature may be increased. Generally the increase in slope may be greater if the number concentration of particles being grown is larger.

Figure 16B:
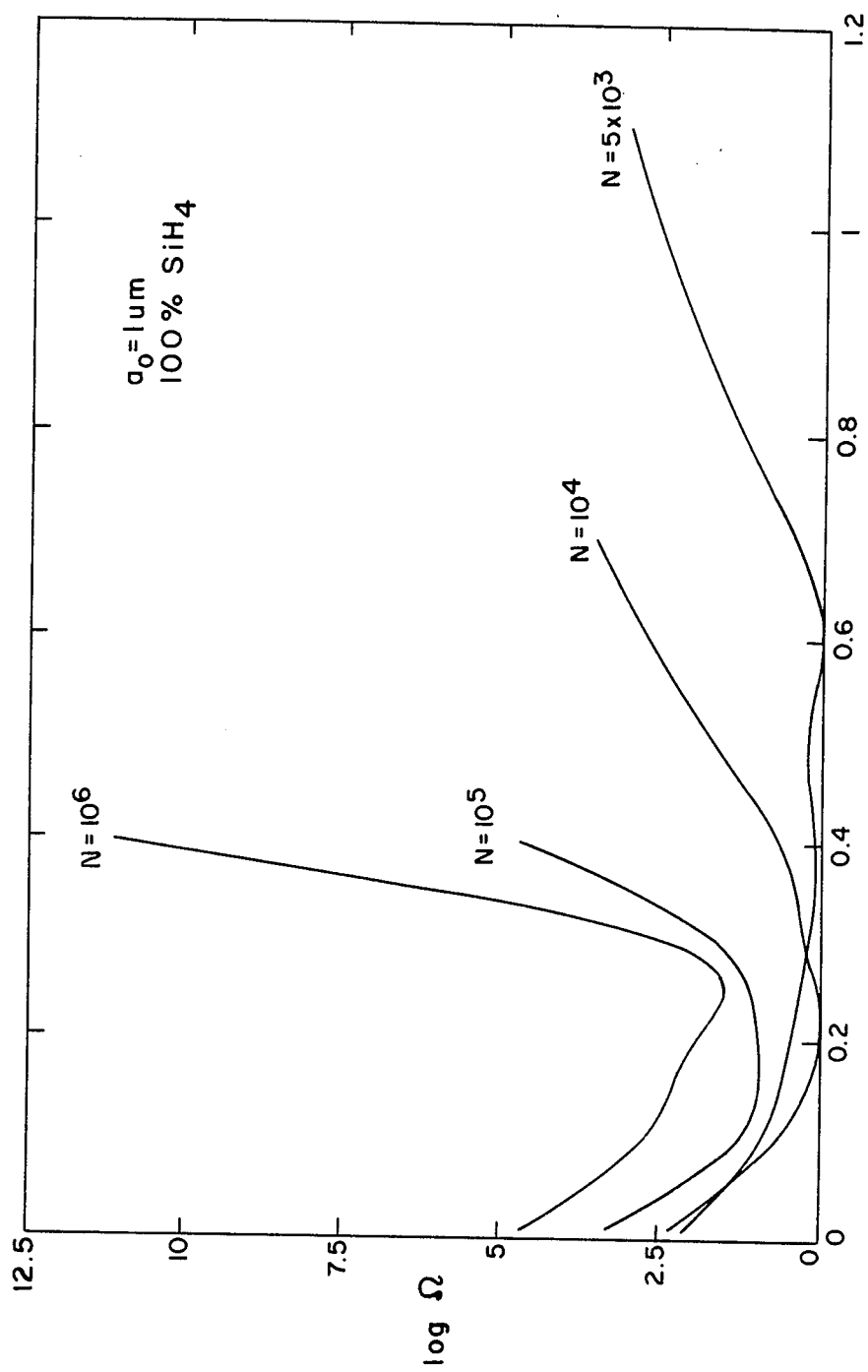

FIG. 16b shows the total clearance volume fraction, $\Omega$, which homogeneous nucleation is quenched for the different number concentration of particles contemplated in the optimization study. These graphs suggest not only the initial temperature rate, but also the time at which the rate may be increased, which is about 0.2 to 0.3 seconds for N equal $10^6$, $10^5$, and $10^4$. For a much lower number concentration, $N=5\times 10^3$, all other conditions remaining the same (and assuming 100% silane), the initial rate must be held much lower for a longer period of about 5 to 6 seconds. Thus for optimization, the total clearance volume fraction of silicon should be driven toward unity during the initial period controlled by the selection of the initial temperature slope. Then at a time when the total clearance volume fraction has reached a minimum, the temperature slope may be increased. Ideally, the slope should be great enough to maintain the total clearance volume fraction near unity for most of the remaining time in the reactor, as noted hereinbefore with reference to FIG. 9. This ideal was very nearly achieved by this optimization study for the small particle concentration of $5\times 10^3$. The optimization study assumed the rate of temperature increase to be at about 3 seconds for the higher number concentrations, and at about 5 seconds for the low number concentration of $5\times 10^3$.

Figure 16C:
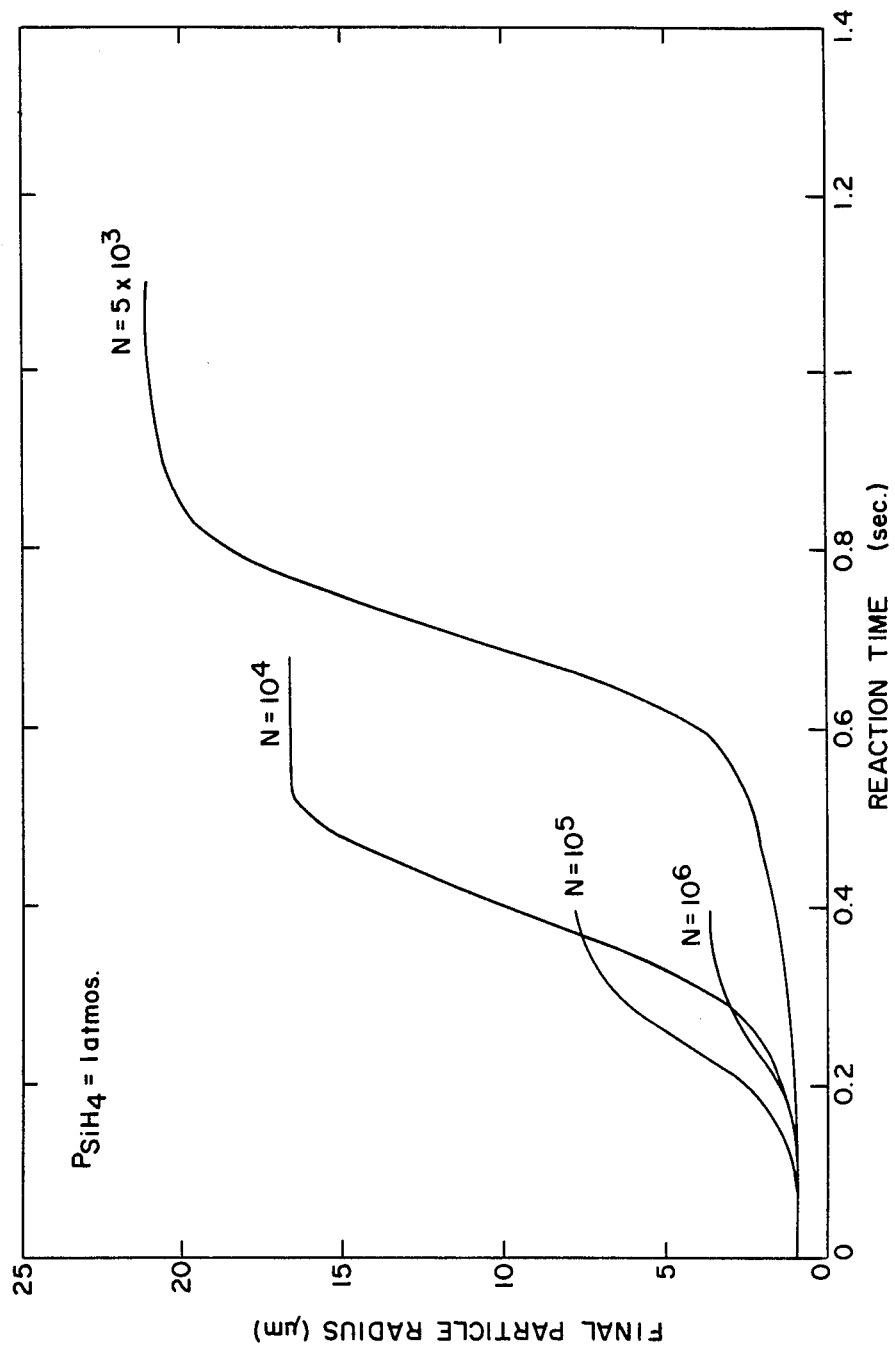

FIG. 16c shows the final particle size as a function of time. For the higher number concentrations of $10^5$ and $10^6$, the final particle size reached in about 0.4 seconds is below 10 microns. Although significantly better than the submicron particle size of the prior-art free-space reactors, the lower number concentration ($N=10^4$) and lower rates of temperature increase yields much larger particle (about seven times greater than for $N=10^6$ and about two and a half times greater than for $N=10^5$). A still lower number concentration of $5\times 10^3$, and lower rates of temperature increase, yields an increase of particle size that is approximately 30%.

Still other combinations of temperature profile and number concentration could be considered. These studies show that the lower the number concentration, the larger the final particle size, and the lower the rate of temperature increase. In each case the temperature profile must be such that reaction will not promote homogenous nucleation of new particles in the reactor, yet great enough to promote maximum particle growth, i.e., to cause all of the silane to react and contribute to particle growth. In that regard, it should be noted the study of temperature profiles shown in FIG. 16a do not include a final burn out zone. In practice, a last section of the free-space reactor will be provided and maintained at the high temperature reached in order to assure pyrolytic reaction of all the silane.

Figure 17A:
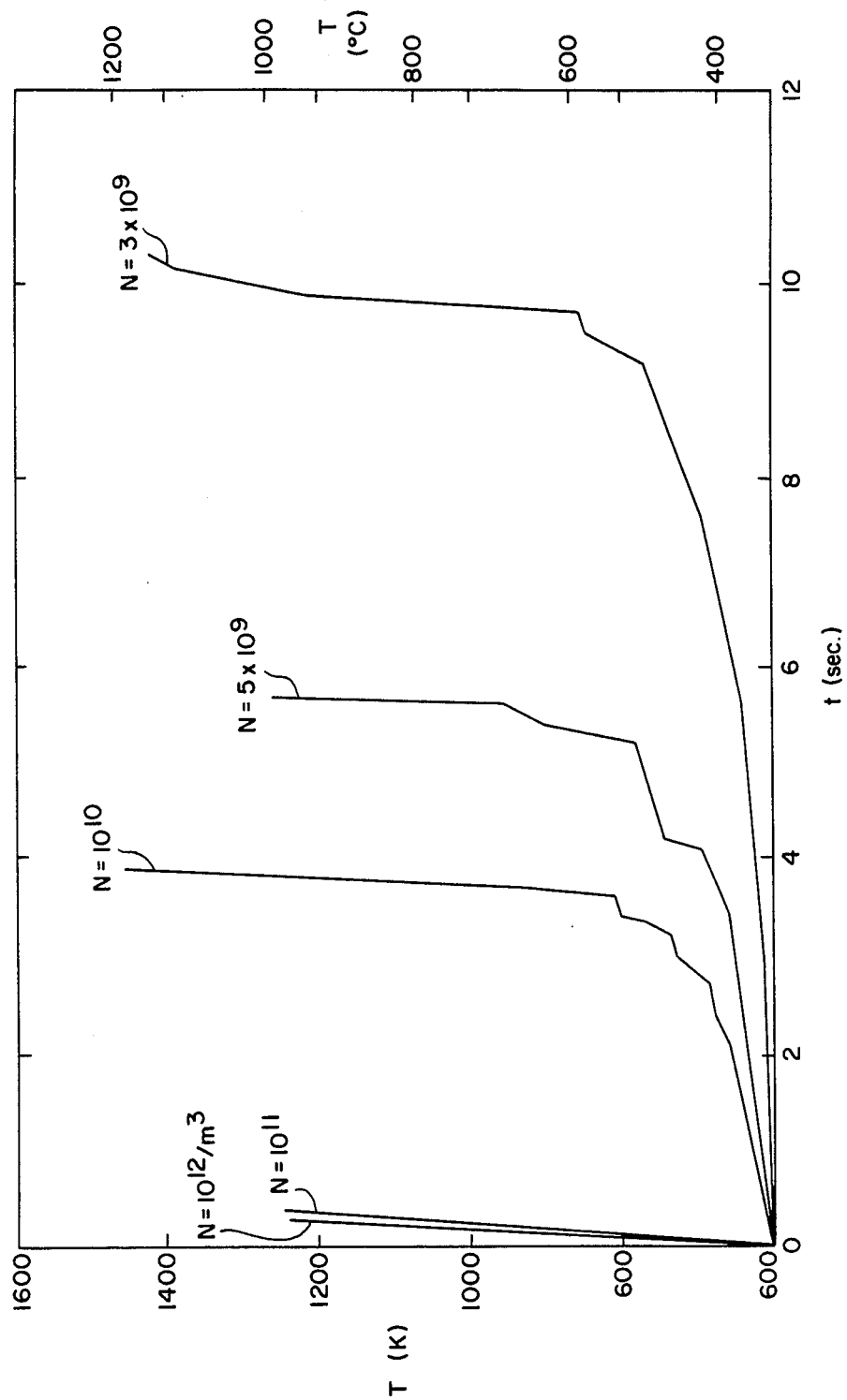
FIGS. 17a, b and c are respective graphs of three predicted temperature profiles, total clearance volume fraction at which nucleation is quenched, and final particle size (radius in micrometers), all as a function of time, corresponding to respective FIGS. 16a, b and c, to illustrate further optimization of the free-space reactor.
Figure 17B:
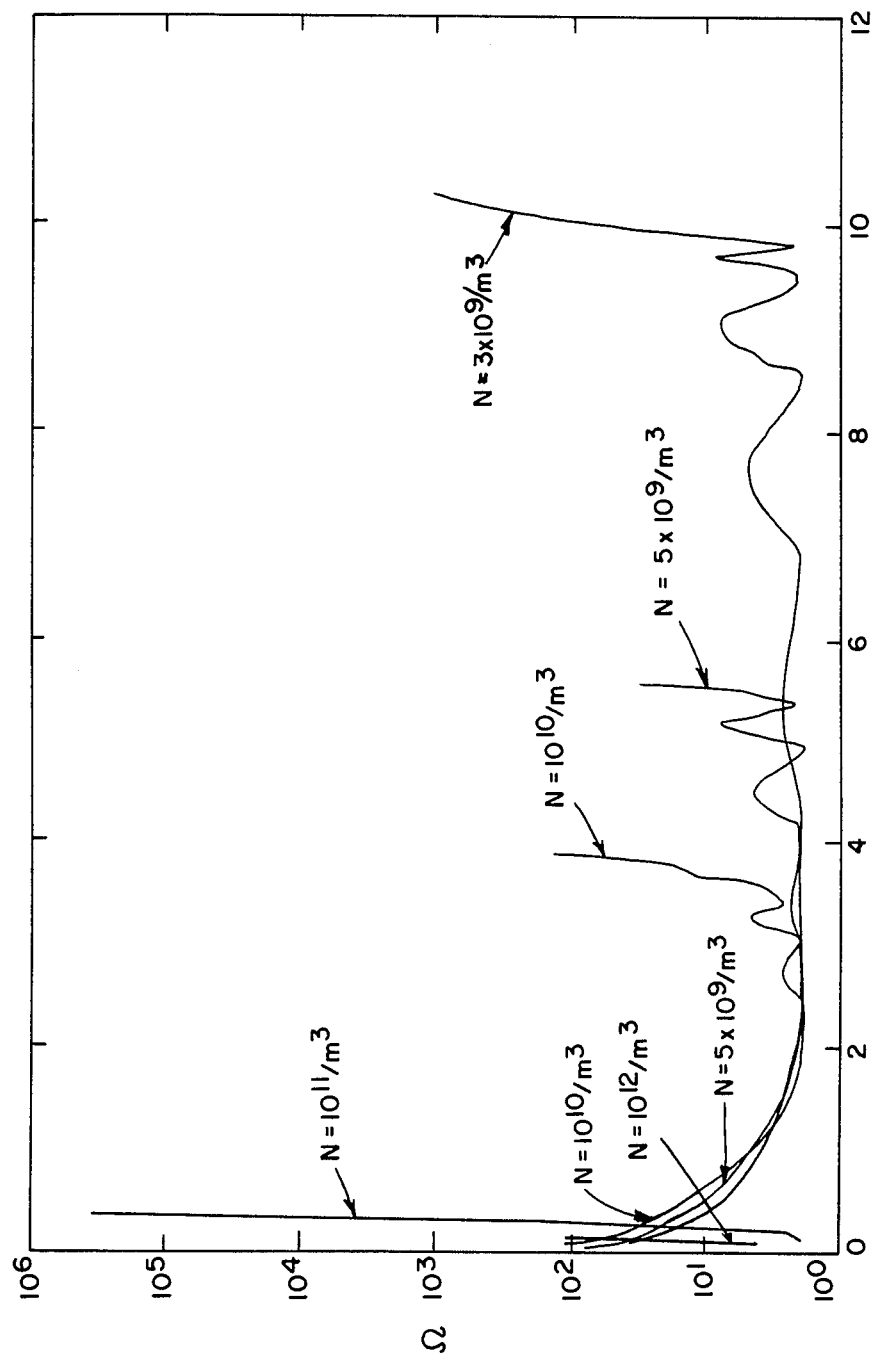
Figure 17C:
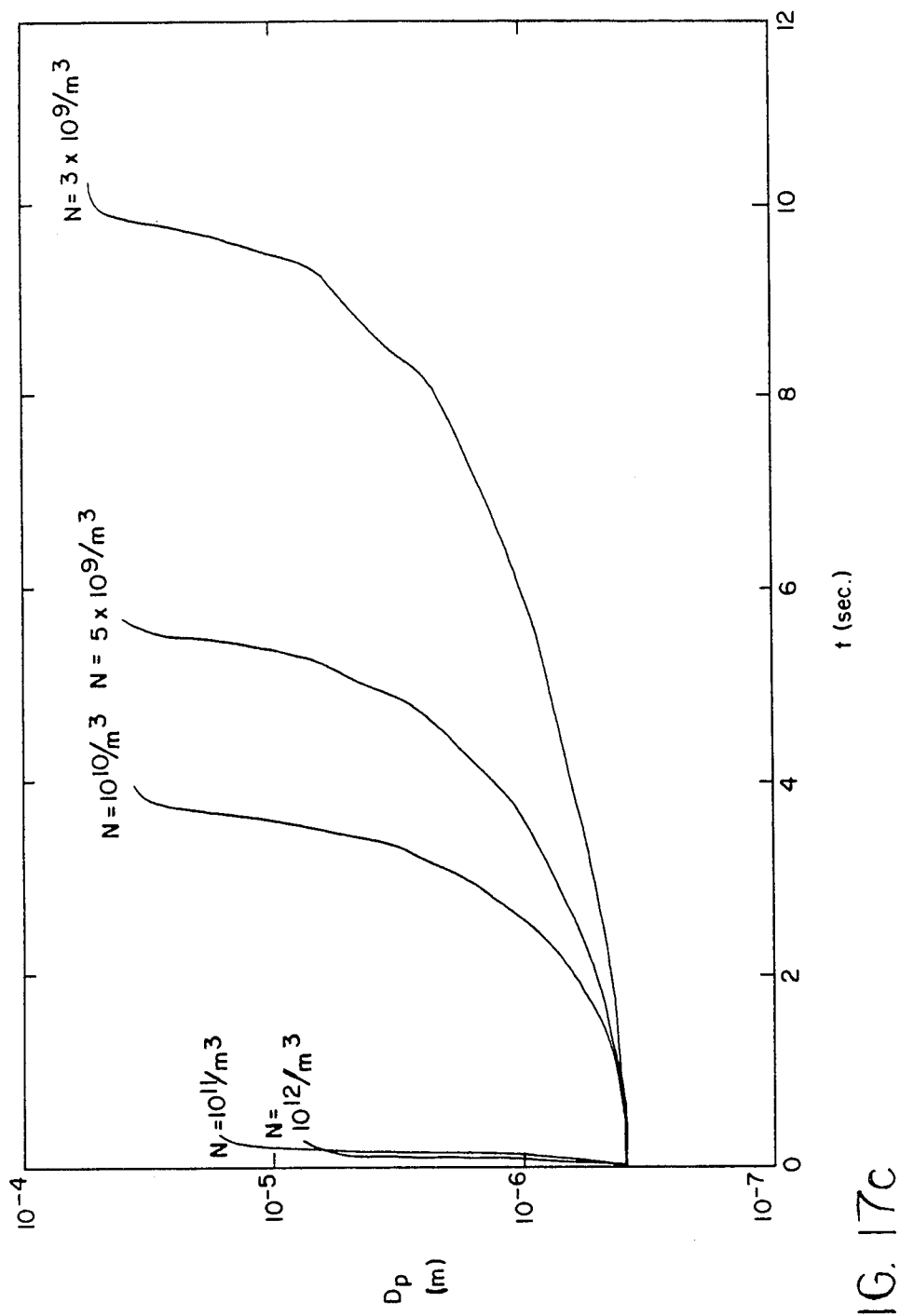

FIGS. 17a, b and c, corresponding to FIGS. 16a, b and c, illustrate further optimization of the free-space reactor. In this case the temperature in the reactor has been continuously modified in order to keep the total clearance volume fraction low throughout the residence time in the reactor. Calculations have been carried out for initial seed particle number concentrations of $10^{12}$, $10^{11}$, $10^{10}$, $5\times 10^9$, and $3\times 10^9$ particles per standard cubic meter. The temperature profiles for the two highest number concentrations rise very rapidly, indicating the relative ease of controlling new particle formation when the number concentration is high. For lower number concentrations, the temperature initially rises slowly, but the rate of increase accelerates as the seed particles grow and begin to inhibit nucleation in a larger volume of gas. The total clearance volume fractions were not allowed to drop below 2 at any point in the reactor in order to provide a margin of safety in the prevention of unwanted nucleation. In the final stage of the reaction, the temperature increase insures that the silane is completely reacted. Particle growth occurs very rapidly in the case of the high number concentrations, but the final particle size is limited by the amount of silane available for particle growth. The time required for the reaction becomes substantially longer for the lower number concentrations of seed particles, but even at $3\times 10^9$ particles per cubic meter, particle growth can be achieved in less than 11 seconds of residence time in the reactor. The initial temperature used in these calculations was lower than that used in FIG. 16, i.e., 600° K. instead of 775° K. in order to allow the possibility of growing particles to greater than 50 microns in diameter from seed particles of 0.4 microns in diameter, a more readily achievable starting condition than the 2 micron diameter seed particles used in the previous example. It is seen that, by careful control of the silane reaction rate using reactor temperature as the controlling parameter, very large particles can be grown from seed particles in a free-space reactor.

Although particular embodiments of the invention have been described and illustrated herein for growing silicon particles from silane in a free-space pyrolytic reactor, it is recognized that the general principles of a controlled rate of reaction for a controlled number concentration of seed particles is applicable to other systems besides silane, and even applicable to other systems that are not pyrolytic reactors but rather chemical reactors. Consequently, it is intended that the claims be interpreted to cover such equivalent systems.

What is claimed is:

1. A method for producing particles of material from a gas, or gases, using a free-space flow reactor, said reactor having a mixing zone in series with a primary reaction zone, comprising the steps of introducing into said mixing zone said gas, or mixture of said gases, for flow through said reactor, mixing a concentration of seed particles of said material with said gas, or gases, in said mixing zone, said concentration being limited such that the quantity of said gas or gases is sufficient to grow each of the particles in the reactor to the desired size larger than one micron within the reactor by vapor deposition alone, and reacting said gas or gases in said primary reaction zone at a rate which is limited such that the products of gas phase reactions deposit on the seed particles entrained in the flow through said reactor, the rate of deposition being sufficient for the limited reacting rate to prevent homogenous nucleation of new particles, the ultimate particles size being less than 100 microns and the reaction time in said primary reaction zone being of the order of 0.2-10 seconds.

2. A method as defined in claim 1 wherein said seed particles are produced by reaction leading to formation of an aerosol of seed particles by homogenous nucleation prior to flow of said particles through said primary reaction zone.

3. A method as defined in claim 1 wherein said seed particles are produced in a preliminary step using a reactor through which a small quantity of said gas or gases flow for reacting said material at a rate sufficient for homogeneous nucleation of seed particles, following which said seed particles are introduced into said mixing zone with said gas or gases.

4. A method as defined in claim 2 or 3 wherein said reaction rate in said primary reaction zone is limited to prevent new particle formation by control of the temperature of said gas or gases flowing therethrough by temperature control beginning at a temperature at which the rate of reaction to generate considerable vapors is sufficiently slow to prevent significant reaction within the residence time available at the gas inlet end of said reactor, and then changing the temperature along the length of the reactor to accelerate the reactions leading to vapor deposition on the seed particle as they flow through the reactor, whereby reaction is limited at all points along the reactor such that vapor deposition on the seed particles occurs preferentially to the formation of new particles by homogenous nucleation.

5. A method as defined in claim 4 wherein a gas is reacted by pyrolysis, and wherein the temperature is then increased to promote reaction leading to vapor deposition on said particles.

6. A method as defined in claim 2 wherein said gas or gases are reacted by pyrolysis in said primary reaction zone and said seed particles are produced by reaction of a portion of said gas, or gases, following which seed particles formed are mixed with the unreacted gas, or gases.

7. A method as defined in claim 3 wherein a gas, or mixture of gases, are reacted by pyrolysis in said primary reaction zone for growing particles from seed particles, and said seed particles are produced in said preliminary step by pyrolytic reaction of a quantity of said gas, or gases.

8. A method as defined in claim 2 or 3 wherein a mixture of two or more gases is introduced into said reactor, and said reaction rate in said primary reaction zone is regulated by control of one or more parameters known to affect the rate of reaction in a given system.

9. A method for growing silicon particles from a gas or gases containing silicon using a free-space pyrolytic reactor through which said gas or gases flow, said reactor having a mixing zone and a primary reaction zone, comprising the steps of introducing a flow of said gas or gases through said reactor, mixing a predetermined concentration of seed particles of silicon with said gas or gases in said mixing zone, said concentration being limited such that the quantity of said gas or gases is sufficient to grow each of the particles in the reactor to the desired size larger than one micron within the reactor by vapor deposition alone, and growing said particles in said primary reaction zone to an ultimate size less than 100 microns during a residence time on the order of 0.2-10 seconds by vapor deposition of silicon on said seed particles by control of the temperature of said gas or gases flowing therethrough by temperature control beginning at a temperature at which the rate of reaction to generate considerable vapors is sufficiently slow to prevent significant reaction within the residence time available at the gas inlet end of said reactor, and then changing the temperature along the length of the reactor to accelerate the reactions leading to vapor deposition on the seed particles as they flow through the reactor, whereby reaction is limited at all points along the reactor such that vapor deposition on the seed particles occurs preferentially to the formation of new particles by homogenous nucleation.

10. A method as defined in claim 9 wherein said seed particles are produced as said flow of said gas or gases is introduced into said mixing zone by pyrolytic reaction leading to formation of seed particles prior to flow of said gas or gases through said primary reaction zone.

11. A method as defined in claim 10 wherein said gas or gases are reacted by pyrolysis to produce seed particles by introducing a hot nonreacting gas into said gas or gases to heat a portion of said gas or gases to a temperature sufficient for pyrolytic reaction leading to the formation of seed particles, following which seed particles formed are mixed with the unreacted gas, or gases.

12. A method as defined in claim 9 wherein said seed particles are produced in a preliminary step using a pyrolytic reactor through which a small quantity of said gas or gases flow, following which said seed particles are introduced into said mixing zone with an additional amount of said gas or gases.

13. A method of promoting growth of particles from a controlled concentration of seed particles introduced into a free-space reactor, in preference to the formation of new particles by homogenous nucleation, comprising the step of limiting the rate of the gas phase reactions during a reaction time on the order of 0.2-10 seconds to the point that said particles scavenge condensible reaction products at a rate that keeps the vapor pressure below a level necessary for homogenous nucleation of new particles, while the particles size does not exceed 100 microns.

* * * * *